United States Patent
Park

(10) Patent No.: US 9,978,435 B1
(45) Date of Patent: May 22, 2018

(54) MEMORY DEVICE AND OPERATION METHODS THEREOF

(71) Applicant: WINBOND ELECTRONICS CORPORATION, Taichung (TW)

(72) Inventor: San-Ha Park, Hsinchu (TW)

(73) Assignee: Winbond Electronics Corporation, Taichung (TW)

( * ) Notice: Subject to any disclaimer, the term of this patent is extended or adjusted under 35 U.S.C. 154(b) by 0 days. days.

(21) Appl. No.: 15/415,489

(22) Filed: Jan. 25, 2017

(51) Int. Cl.
| | |
|---|---|
| G11C 11/14 | (2006.01) |
| G11C 11/406 | (2006.01) |
| G11C 11/4091 | (2006.01) |
| G11C 11/408 | (2006.01) |
| G11C 11/4096 | (2006.01) |
| G11C 11/419 | (2006.01) |
| G11C 11/417 | (2006.01) |

(52) U.S. Cl.
CPC .... G11C 11/40615 (2013.01); G11C 11/4085 (2013.01); G11C 11/4087 (2013.01); G11C 11/4091 (2013.01); G11C 11/4096 (2013.01); G11C 11/419 (2013.01); *G11C 11/417* (2013.01)

(58) Field of Classification Search
None
See application file for complete search history.

(56) References Cited

U.S. PATENT DOCUMENTS

| | | | |
|---|---|---|---|
| 5,555,528 A | 9/1996 | Collins et al. | |
| 6,236,605 B1 * | 5/2001 | Mori | G11C 5/14 365/189.09 |
| 6,529,434 B2 * | 3/2003 | Kitamoto | G11C 7/1051 365/207 |
| 6,795,328 B2 * | 9/2004 | Kato | G11C 7/065 257/E27.097 |
| 6,868,027 B2 | 3/2005 | Kawaguchi | |
| 7,031,219 B2 * | 4/2006 | Hsu | G11C 5/147 365/185.23 |
| 7,042,781 B2 * | 5/2006 | Kim | G11C 7/065 327/296 |

(Continued)

FOREIGN PATENT DOCUMENTS

JP 2002/260383 A 9/2002

*Primary Examiner* — Son Mai
(74) *Attorney, Agent, or Firm* — Finnegan, Henderson, Farabow, Garrett & Dunner LLP

(57) ABSTRACT

A memory device includes a memory array including a plurality of memory cells coupled to a plurality of bitlines and a plurality of wordlines and a plurality of sense amplifier circuits coupled to the plurality of bitlines. Each sense amplifier circuit includes a sense amplifier configured to sense and amplify a voltage difference between two of the bitlines coupled thereto. The memory device further includes an address decoder to receive and decode addresses of memory cells to enable corresponding bitlines and wordlines, a refresh controller to control data refreshing of the memory cells, and a mode controller to control the memory device to operate in different operating modes including a deep power down (DPD) mode. The mode controller controls data of a group of the memory cells, sensed by corresponding ones of the sense amplifier circuits, to be latched in the corresponding sense amplifier circuits when entering the DPD mode.

28 Claims, 18 Drawing Sheets

(56) References Cited

U.S. PATENT DOCUMENTS

| | | | |
|---|---|---|---|
| 7,184,342 B2* | 2/2007 | Seo ........................ | G11C 7/06 365/203 |
| 7,248,522 B2* | 7/2007 | Hardee ................. | G11C 7/065 365/189.05 |
| 7,372,746 B2* | 5/2008 | Kim ........................ | G11C 7/08 365/189.06 |
| 7,663,954 B2* | 2/2010 | Teramoto ............... | G11C 7/065 365/189.05 |
| 7,929,367 B2* | 4/2011 | Yoo ........................ | G11C 7/065 365/189.05 |

* cited by examiner

MEMORY DEVICE AND OPERATION METHODS THEREOF

TECHNICAL FIELD

The present application relates to semiconductor memory technologies, and more particularly, to low-power memory devices and operation methods thereof.

BACKGROUND

Dynamic random access memories (DRAMs) provide fast and high-volume memories for data access in computer and mobile computer systems. Power consumption has been a concern about DRAMs because DRAMs require data refreshing periodically. One conventional design for DRAMs includes introducing a deep power down (DPD) mode. However, in the DPD mode, data stored in a DRAM may be destroyed. In addition, it may need a long period of time, e.g. 500 us, to recover access to the DRAM from a DPD mode.

One conventional approach for preventing data loss in DRAMs in a DPD mode is using static random access memories (SRAMs) to hold data while in a DPD mode. However, adding SRAM cells may incur large area overhead and increase response time for data access. Another conventional approach for reducing power consumption is utilizing a self-refresh mode to maintain data and provide data access to DRAMs within about 100 ns from the self-refresh mode. However, such a self-refresh mode may require considerable power consumption.

SUMMARY

One aspect of the present disclosure is directed to a memory device. The memory device includes a memory array including a plurality of memory cells coupled to a plurality of bitlines and a plurality of wordlines. The memory device also includes a plurality of sense amplifier circuits coupled to the plurality of bitlines. Each sense amplifier circuit includes a sense amplifier and is configured to sense and amplify a voltage difference between two of the bitlines coupled thereto. The memory device further includes an address decoder to receive and decode addresses of memory cells to enable corresponding bitlines and wordlines. In addition, the memory includes a refresh controller to control data refreshing of the memory cells. Moreover, the memory device includes a mode controller to control the memory device to operate in different operating modes including a deep power down (DPD) mode. The mode controller controls data of a group of the memory cells, sensed by corresponding ones of the sense amplifier circuits, to be latched in the corresponding sense amplifier circuits when the memory device enters the DPD mode.

Another aspect of the present disclosure is directed to an apparatus for data processing. The apparatus includes a memory device to store data to be processed. The data to be processed includes at least one of instructions, execution status, or user data. The apparatus also includes a processor coupled to the memory device. The processor is configured to access the memory device during processing. The apparatus further includes a storage unit coupled to the processor. The storage unit stores an operating system. The memory device includes a memory array including a plurality of memory cells coupled to a plurality of bitlines and a plurality of wordlines. The memory device also includes a plurality of sense amplifier circuits coupled to the plurality of bitlines. Each sense amplifier circuit includes a sense amplifier and is configured to sense and amplify a voltage difference between two of the bitlines coupled thereto. The memory device further includes an address decoder to receive and decode addresses of memory cells to enable corresponding bitlines and wordlines. In addition, the memory device includes a refresh controller to control data refreshing of the memory cells. Moreover, the memory device includes a mode controller to control the memory device to operate in different operating modes including a deep power down (DPD) mode. The mode controller controls data of a group of the memory cells, sensed by corresponding ones of the sense amplifier circuits, to be latched in the corresponding sense amplifier circuits when the memory device enters the DPD mode. A group of the data to be processed are retained in the memory device when the apparatus enters a suspend mode.

Yet another aspect of the present disclosure is directed to a method for retaining data in a deep power down (DPD) mode of a memory device including memory cells. The method includes receiving a signal to enter the DPD mode. The method also includes controlling the memory device to enter the DPD mode. The method further includes retaining in the memory device data of a group of memory cells when the memory device enters the DPD mode. In addition, the method includes controlling the memory device to operate in different operating modes including the DPD mode.

DETAILED DESCRIPTION

This disclosure is generally directed to low-power memory devices, such as DRAM devices, and operation methods thereof for retaining data in a DPD mode. It is contemplated that a memory device may retain a group of data stored in the memory device while the memory device is in the DPD mode. The group of data to be retained may be selected. The group of data may be retained in sense amplifiers of the memory device while the memory device is in the DPD mode. It is also contemplated that the memory device may include a plurality of latches for retaining data in the DPD mode. The memory device may retain a group of data stored in the memory device in the latches and/or the sense amplifiers while the memory device is in the DPD mode.

Figure 1A:
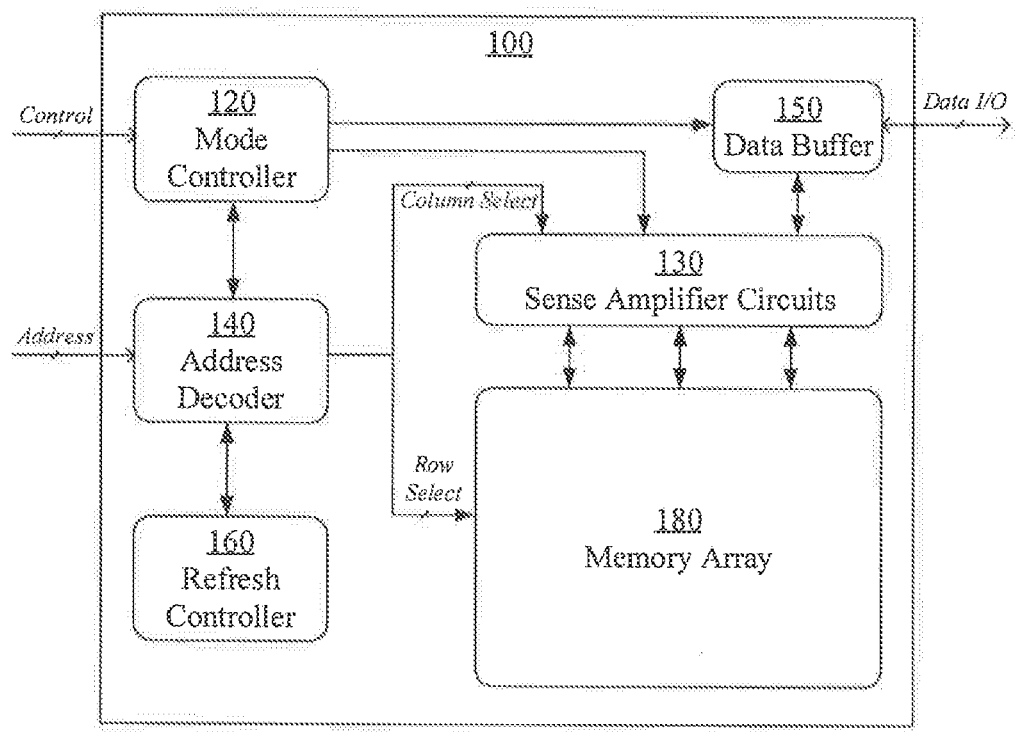
FIG. 1A is an illustration of an exemplary memory device, according to a disclosed embodiment.

FIG. 1A is an illustration of an exemplary memory device 100, according to a disclosed embodiment. Memory device 100 includes a mode controller 120, an address decoder 140, a refresh controller 160, a memory array 180, a plurality of sense amplifier circuits 130, and a data buffer 150, coupled to each other as shown in FIG. 1A. Data buffer 150 may include appropriate hardware, such as a plurality of registers, integrated circuits, and/or field programmable gate arrays. Data buffer 150 is configured to temporarily hold output or input data during data reading or writing from or to memory device 100. Memory array 180 includes a plurality of memory cells coupled to a plurality of bitlines and a plurality of wordlines (shown in FIG. 2). The plurality of memory cells are for storing data for subsequent access. Memory device 100 may be provided as a DRAM device.

Figure 3:
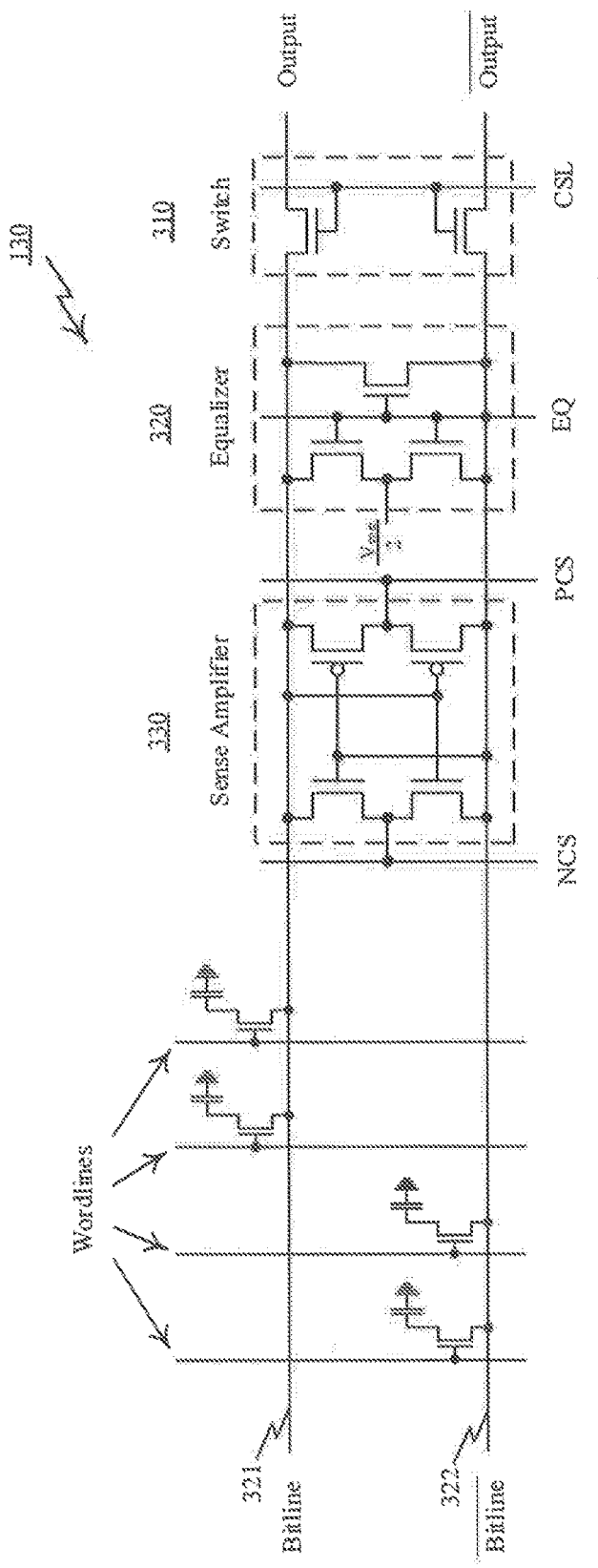
FIG. 3 is an illustration of an exemplary sense amplifier circuit in the exemplary memory device shown in FIG. 1A.

Each sense amplifier circuit 130 includes a sense amplifier and peripheral circuit (shown in FIG. 3). The plurality of sense amplifier circuits 130 are coupled to the plurality of bitlines in memory array 180. Each sense amplifier circuit 130 is configured to sense and amplify a voltage difference between two bitlines coupled thereto. A voltage difference on two bitlines is caused by data stored in one of the memory cells coupled to the two bitlines and being read during data access. Address decoder 140 receives and decodes addresses of memory cells to enable corresponding bitlines and wordlines for data access. Refresh controller 160 includes appropriate hardware, such as integrated circuits and/or field programmable gate arrays. Refresh controller 160 is configured to control periodic refreshing of data stored in the memory cells.

Mode controller 120 includes appropriate hardware, such as integrated circuits, and/or programmable gate arrays configured to generate control signals. Mode controller 120 is configured to generate such control signals to control memory device 100 to operate in different operation modes, such as Read, Write, Refresh, and DPD modes. Mode controller 120 is coupled to receive externally generated control signals, such as may be generated by, e.g., a processor or timer, of the system within which memory device 100 is implemented. Memory device 100 is controlled by mode controller 120 to enter the DPD mode when mode controller 120 receives such an externally generated control signal instructing entry into the DPD mode. Mode controller 120 controls data of a group of memory cells to be latched when memory device 100 is in the DPD mode. In some embodiments, the data of the group of memory cells may be latched in the sense amplifiers coupled thereto through the bitlines. The data of the group of memory cells is restored to the group of memory cells when memory device 100 exits the DPD mode.

Figure 1B:
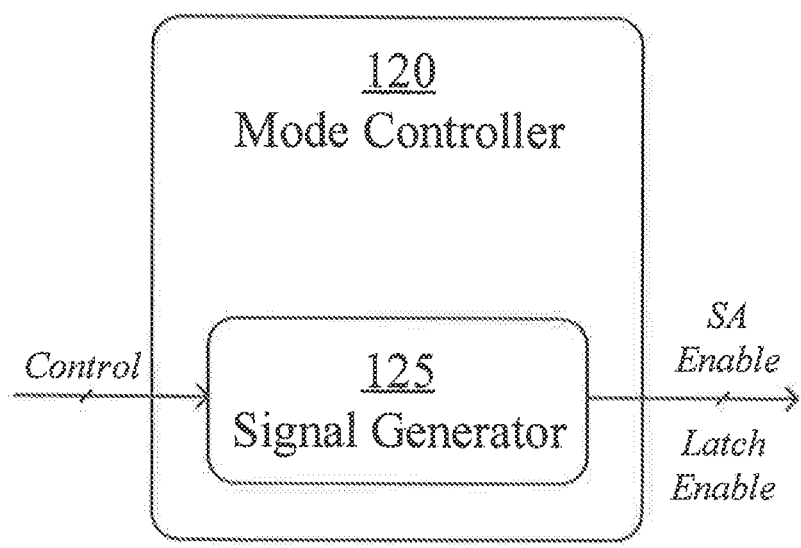
FIG. 1B is an illustration of an exemplary mode controller.

FIG. 1B is an illustration of an exemplary mode controller 120. As shown in FIG. 1B, mode controller 120 includes a signal generator 125 configured to generate one or more of various control signals for controlling operations of memory device 100. Signal generator 125 generates the various control signals in accordance with the external control signals received from the system within which memory device 100 is implemented. As described above, signal generator 125 includes appropriate hardware, such as integrated circuits, and/or programmable gate arrays for generating the various control signals to control operation of memory device 100. The signals include control signals to enable sense amplifiers and latches, as well as others, as more fully described below.

Figure 2:
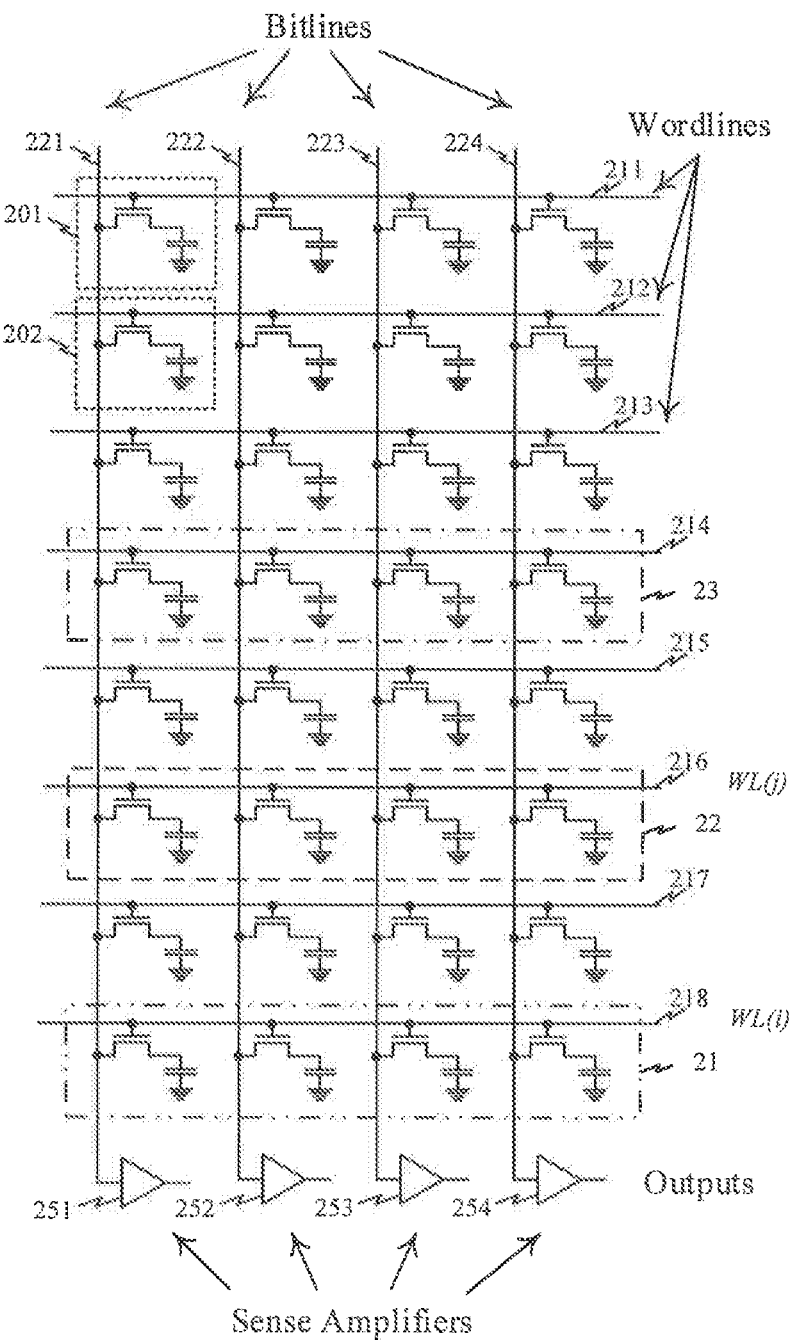
FIG. 2 is an illustration of an exemplary memory array in the exemplary memory device shown in FIG. 1A.

FIG. 2 is an illustration of exemplary memory array 180 in exemplary memory device 100, according to a disclosed embodiment. Memory array 180 includes a plurality of memory cells, e.g., memory cells 201 and 202, coupled to a plurality of bitlines, e.g., bitlines 221, 222, 223, and 224, and a plurality of wordlines, e.g., wordlines 211, 212, 213, 214, 215, 216, 217, and 218. For example, memory cells 201 and 202 are coupled to two wordlines 211 and 212, respectively, and coupled to the same bitline 221 as shown in FIG. 2. Each memory cell includes a transistor and a capacitor coupled to the drain or the source of the transistor. Each memory cell is capable of storing one bit of data in its capacitor. The gate of the transistor is coupled to a wordline. The remaining source or drain of the transistor that is not coupled to the capacitor is coupled to a bitline. When the wordline is activated, data on the bitline is conducted to the capacitor in a Write operation. In a Read operation, data stored in the capacitor is conducted to the bitline when the wordline is activated. Each wordline may be coupled to, for example, 1, 2, 4, 8, or 16 memory cells. When the wordline is activated, all coupled memory cells may be accessed at the same time. A bitline is coupled to a sense amplifier and a plurality of memory cells that are coupled to different wordlines. When one of these wordlines is activated, data stored in the coupled memory cell is conducted to the bitline, and sensed and amplified by the sense amplifier. For example, when wordline 211 is activated, data stored in memory cell 201 is conducted to bitline 221, sensed and amplified by a sense amplifier 251 coupled to bitline 221, and then conducted to an output. As another example, when wordline 212 is activated, data stored in memory cell 202 is conducted to bitline 221, and sensed and amplified by sense amplifier 251, and then conducted to an output.

FIG. 3 is an illustration of exemplary sense amplifier circuit 130 including a sense amplifier 330 corresponding to one of a pair of bitlines of exemplary memory device 100, according to a disclosed embodiment. Sense amplifier 330 is coupled between two bitlines 321 and 322. Sense amplifier 330 includes several transistors to sense and amplify a small voltage difference between bitlines 321 and 322 to a recognizable logic level so that data can be interpreted by logic circuits outside the memory. Sense amplifier 330 includes, for example, two cascaded p-type MOSFETs and two cascaded n-type MOSFETs, cross-coupled as shown in FIG. 3. Mode controller 120 generates control signals to activate and drive sense amplifier 330 to a maximum or minimum voltage level, that serves as the recognizable logic level corresponding to the data being read. In some embodiments, sense amplifier 330 may include different numbers, types, and/or couplings of transistors.

In addition to sense amplifier 330, sense amplifier circuit 130 includes an equalizer 320 and a switch 310 that are coupled between bitlines 321 and 322. For a read operation, equalizer 320 precharges bitlines 321 and 322 to ensure that their respective voltages are substantially equal prior to connecting a memory cell to one of the bitlines. A control signal EQ controls equalizer 320 to equalize the voltages of bitlines 321 and 322. Subsequently, after the memory cell is connected to one of the bitlines and sense amplifier 330 has amplified the sensed voltage difference between the bitlines, a control signal CSL controls switch 310 to turn on output transistors to provide the amplified voltage on the output for reading out of memory device 100.

Figure 4:
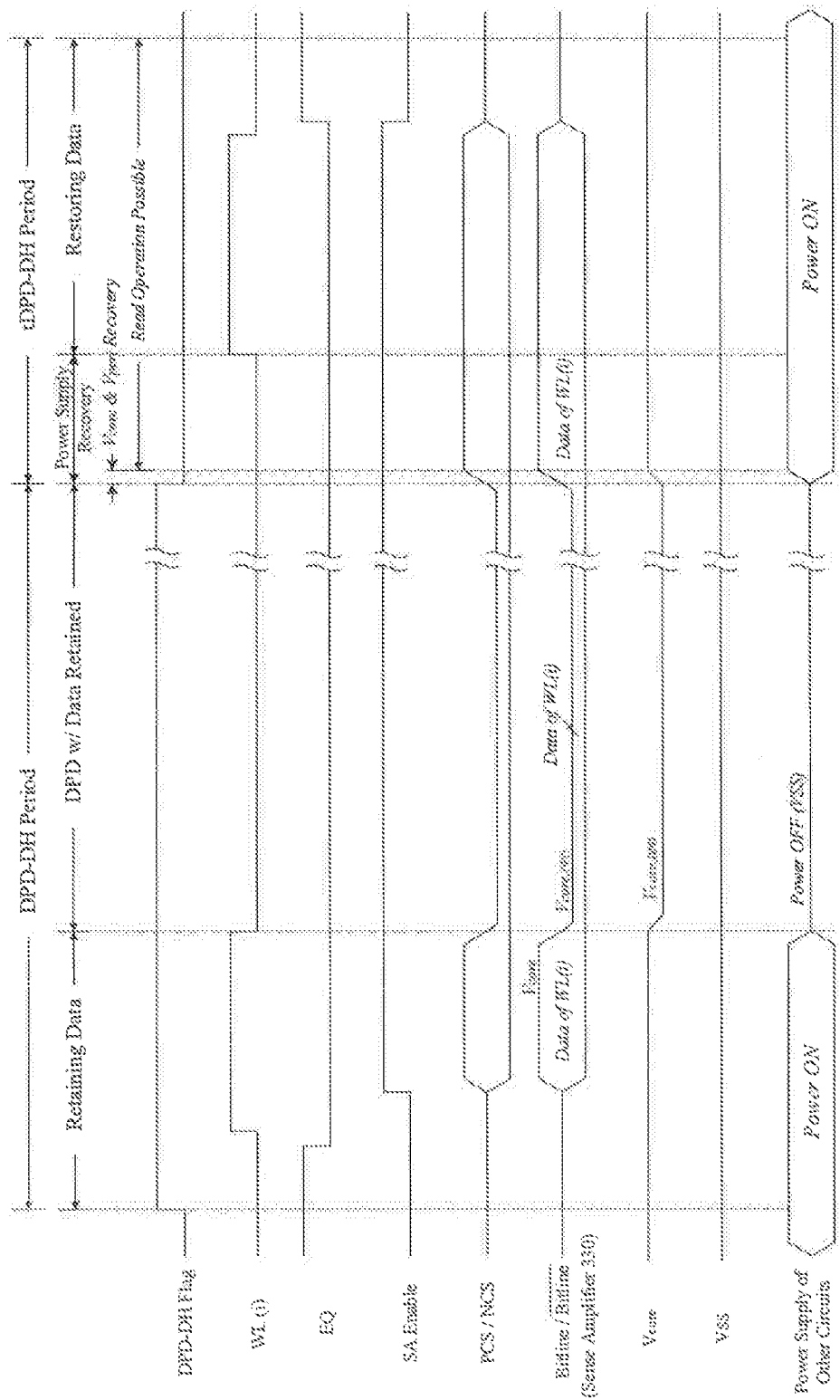
FIG. 4 is an exemplary timing diagram of an exemplary memory device retaining data in a DPD mode, according to a disclosed embodiment.

FIG. 4 is an exemplary timing diagram of exemplary memory device 100 retaining data in an exemplary DPD mode, according to a disclosed embodiment. Mode controller 120 controls related control signals in FIG. 4 to activate corresponding modules or circuits of memory device 100 according to the timing diagram. When memory device 100 receives a signal to enter the DPD mode, mode controller 120 controls related control signals to retain data in memory device 100 before entering into the DPD mode. For example, memory device 100 receives a deep power down data holding (DPD-DH) flag signal to request entering the DPD mode and retaining data stored in memory device 100, as shown in FIG. 4. Mode controller 120 is configured to retain data stored in a memory cell coupled to wordline i, WL(i). Mode controller 120 activates wordline i by WL(i) signal, and equalizer 320 and sense amplifier 330 coupled to wordline i by EQ and SA Enable signals respectively, as shown in FIG. 4. The SA Enable signal enables sense amplifier 330, causing sense amplifier 330 to sense and amplify a voltage difference caused by the data stored in the memory cell activated by WL(i). The data stored in the memory cell coupled to wordline i is retained on the bitlines, Bitline/$\overline{\text{Bitline}}$, coupled to the memory cell. The data of the memory cell is latched in sense amplifier 330 because sense amplifier 330 itself is a latch circuit. Sense amplifier 330 latches the data in it as long as power is supplied to sense amplifier 330 and sense amplifier 330 is enabled by the SA Enable signal.

For another example, in FIG. 2, when data of a group of memory cells 21 are configured to be retained in a DPD mode, mode controller 120 activates wordline 218 and retains data stored in the group of memory cells 21 in sense amplifiers 251-254 in the DPD mode. Mode controller 120 restores the retained data to the group of memory cells 21 when memory device 100 exits the DPD mode.

Mode controller 120 controls memory device 100 to enter the DPD mode after the data is retained in sense amplifier 330. Mode controller 120 maintains a power supply to sense amplifier 330 to retain the data latched therein. In some embodiments, mode controller 120 may turn off power supply to other circuits of memory device 100 to reduce power consumption in the DPD mode. For example, mode controller 120 may turn off the power supply to memory array 180, address decoder 140, refresh controller 160, and data buffer 150, or any combination thereof, when memory device 100 enters the DPD mode.

In some embodiments, mode controller 120 may reduce the power supply voltage to sense amplifier 330 latching the data inside in the DPD mode. For example, mode controller 120 may reduce the power supply voltage to sense amplifier 330 from $V_{core}$ to $V_{core, DPD}$, where $V_{core, DPD}$ is a lower voltage level than $V_{core}$, to reduce current consumption. Sense amplifier 330 still retains the data latched inside at the lower voltage level. Mode controller 120 holds memory device 100 in the DPD mode with the data retained until receiving a signal to exit the DPD mode.

When memory device 100 receives a signal to exit the DPD mode, mode controller 120 controls memory device 100 to exit the DPD mode accordingly. For example, when a DPD-DH flag signal is deactivated as shown in FIG. 4, mode controller 120 controls sense amplifier 330 retaining the data to restore the data to the memory cell, and controls memory device 100 to exit the DPD mode. For example, mode controller 120 activates WL(i) and the data latched in sense amplifier 330 is restored to the memory cell through Bitline/$\overline{\text{Bitline}}$.

In some embodiments, if mode controller 120 has turned off the power supply to other circuits of memory device 100 in the DPD mode, mode controller 120 turns on the power supply to those circuits of memory device 100 before restoring the data. For example, if mode controller 120 has turned off the power supply to memory array 180, address decoder 140, refresh controller 160, and data buffer 150, or any combination thereof, when memory device 100 enters the DPD mode, mode controller 120 turns on the power supply to these elements before restoring the data.

In some embodiments, if mode controller 120 has reduced the power supply voltage to sense amplifier 330 latching the data inside in the DPD mode, mode controller 120 recovers the power supply voltage for normal operation before restoring the data. For example, if mode controller 120 has reduced the power supply voltage to sense amplifier 330 from $V_{core}$ to $V_{core, DPD}$, mode controller 120 recovers the power supply voltage to sense amplifier 330 as $V_{core}$ before restoring the data. In some embodiments, the retained data becomes accessible once the power supply voltage is recovered to normal $V_{core}$ because such power supply voltage to sense amplifier 330 provides sufficient driving capability to pass the retained data to other circuits.

Figure 5:
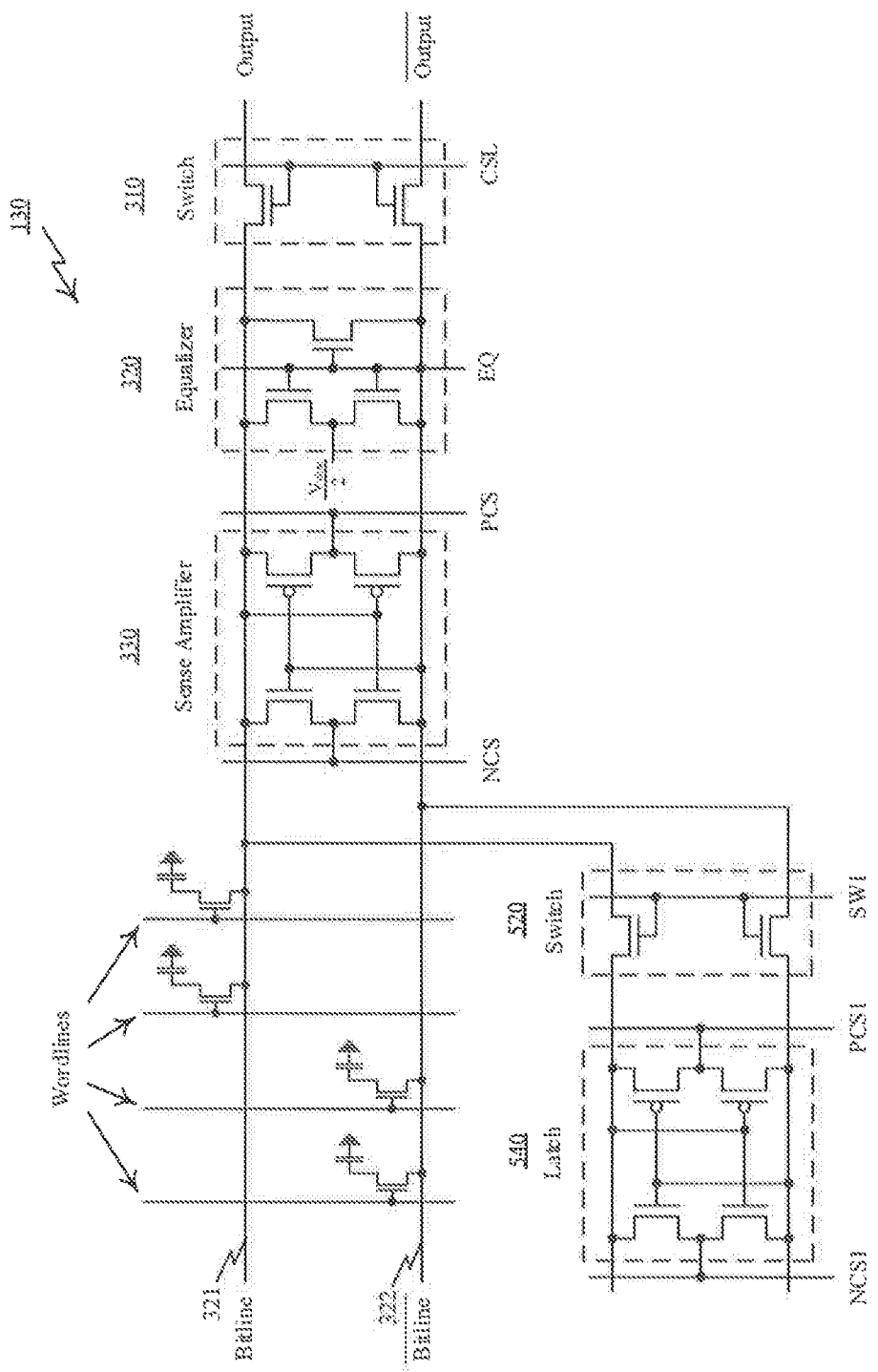
FIG. 5 is an illustration of an exemplary latch coupled to the sense amplifier in FIG. 3.

FIG. 5 is an illustration of exemplary sense amplifier circuit 130 including a latch 540 coupled to bitlines to which exemplary sense amplifier 330 is coupled in memory device 100, according to a disclosed embodiment. Latch 540 is coupled, through a latch switch 520, to the two bitlines, Bitline/$\overline{\text{Bitline}}$, to which sense amplifier 330 is coupled. In other words, in this example, sense amplifier circuit 130 further includes latch 540 and latch switch 520. Latch switch 520 enables latch 540 to retain data on the coupled bitlines when its enable signal, SW1, is activated. Latch 540 includes, for example, two cascaded p-type MOSFETs and two cascaded n-type MOSFETs, cross-coupled as shown in FIG. 5. Mode controller 120 generates control signals to activate and drive latch 540 to retain data on the coupled bitlines. In some embodiments, latch 540 may include different numbers, types, and/or couplings of transistors.

Figure 6:
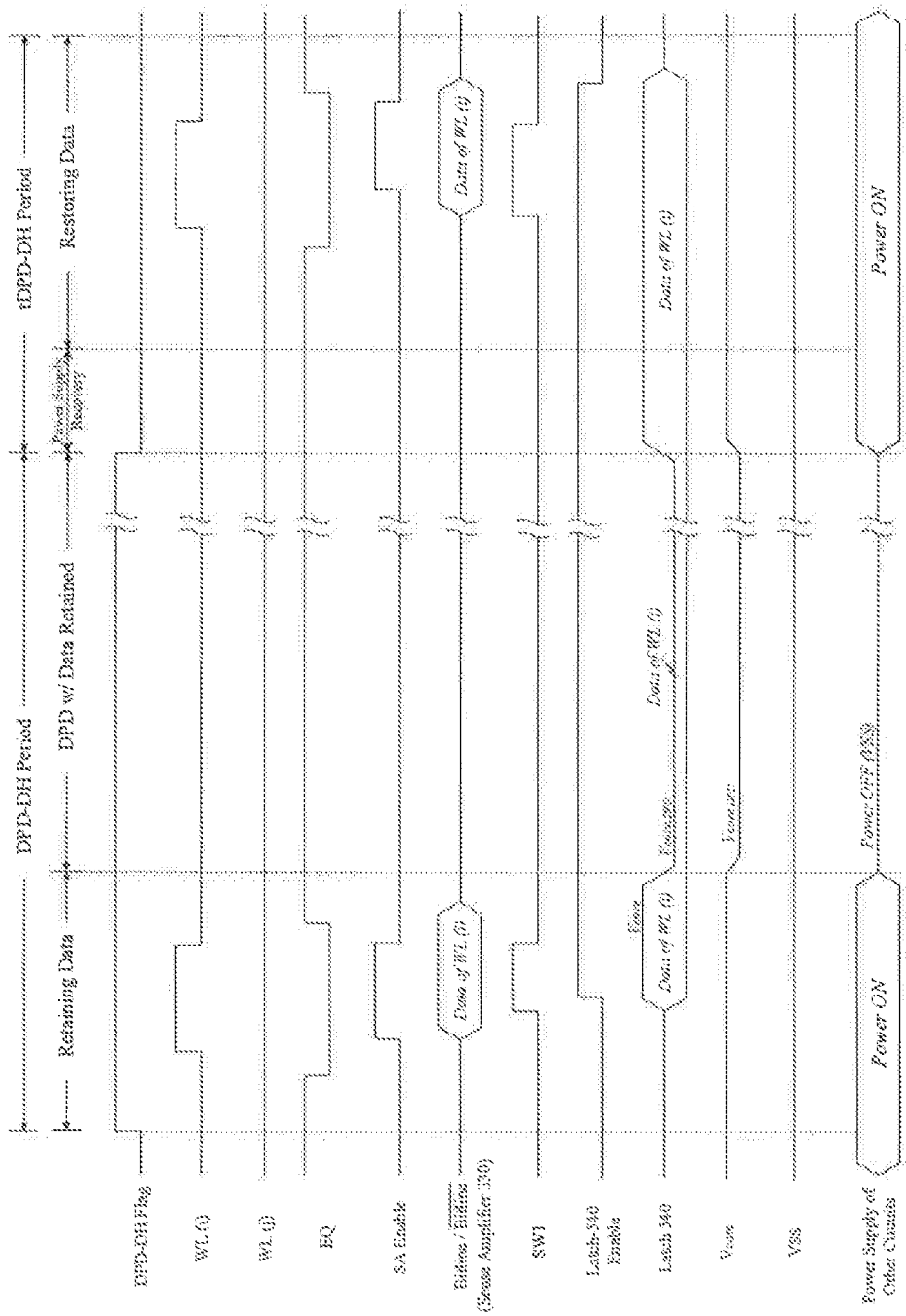
FIG. 6 is an exemplary timing diagram of an exemplary memory device that includes a plurality of the exemplary latches in FIG. 5 and operates in a DPD mode, according to a disclosed embodiment.

FIG. 6 is an exemplary timing diagram of exemplary memory device 100 that includes a plurality of the exemplary latches in FIG. 5 and retains data in the DPD mode, according to a disclosed embodiment. Mode controller 120 controls related control signals in FIG. 6 to activate corresponding modules or circuits of memory device 100 according to the timing diagram. When memory device 100 receives a signal to enter the DPD mode, mode controller 120 controls related control signals to retain data in memory device 100 before entering into the DPD mode. For example, memory device 100 receives a DPD-DH flag signal to cause entering the DPD mode and retaining data stored in memory device 100, as shown in FIG. 6. Mode controller 120 is configured to retain data stored in a memory cell coupled to wordline i, WL(i). Mode controller 120 activates wordline i by WL(i) signal, and activates equalizer 320 and sense amplifier 330 coupled to wordline i by EQ and SA Enable signals respectively, as shown in FIGS. 5 and 6. When the SA Enable signal enables sense amplifier 330, sense amplifier 330 senses and amplifies a voltage difference between bit lines 321 and 322 caused by the data stored in the memory cell activated by WL(i). The data stored in the memory cell coupled to wordline i is retained on the bitlines, Bitline/$\overline{\text{Bitline}}$, coupled to the memory cell. Mode controller 120 activates latch 540 and latch switch 520, coupled to the bitlines, by the SW1 and Latch-540 Enable signals, respectively, as shown in FIG. 6. The data of the memory cell is passed to latch 540. Latch 540 retains the data after latch switch 520 is deactivated. Latch 540 retains the data as long as the power is supplied to latch 540 and latch 540 is enabled by the Latch-540 Enable signal.

As another example, in FIG. 2, when the data of the group of memory cells 21 are configured to be retained in a DPD mode, mode controller 120 activates wordline 218 and retains data stored in the group of memory cells 21 in four latches respectively coupled to bitlines 221-224 in the DPD mode. Mode controller 120 restores the retained data to the group of memory cells 21 when memory device 100 exits the DPD mode.

Mode controller 120 controls memory device 100 to enter the DPD mode after the data is retained in the latch. Mode controller 120 maintains the power supply to latch 540 to retain the data latched. In some embodiments, mode controller 120 may turn off the power supply to other circuits of memory device 100 to reduce power consumption in the DPD mode. For example, mode controller 120 may turn off power supply to memory array 180, sense amplifiers 330 in the plurality of sense amplifier circuits 130, address decoder 140, refresh controller 160, and data buffer 150, or any combination thereof, when memory device 100 enters the DPD mode.

In some embodiments, mode controller 120 may reduce the power supply voltage to latch 540 that retains the data in the DPD mode. For example, mode controller 120 may reduce the power supply voltage to latch 540 from $V_{core}$ to $V_{core, DPD}$, where $V_{core, DPD}$ is a lower voltage level than $V_{core}$, to reduce current consumption. Latch 540 still retains the data latched at the lower voltage level. Mode controller 120 holds memory device 100 in the DPD mode with the data retained until receiving a signal to exit the DPD mode.

When memory device 100 receives a signal to exit the DPD mode, mode controller 120 controls memory device 100 to exit the DPD mode accordingly. For example, when the DPD-DH flag signal is deactivated, as shown in FIG. 6, mode controller 120 controls latch 540 retaining the data to restore the data to the memory cell, and controls memory device 100 to exit the DPD mode. For example, mode controller 120 activates WL(i) and SW1, and the data retained in latch 540 is restored to the memory cell through Bitline/$\overline{\text{Bitline}}$, as shown in FIG. 6.

In some embodiments, if mode controller 120 has turned off the power supply to other circuits of memory device 100 in the DPD mode, mode controller 120 turns on the power supply to those circuits of memory device 100 before restoring the data. For example, if mode controller 120 has turned off the power supply to memory array 180, sense amplifiers 330 in the plurality of sense amplifier circuits 130, address decoder 140, refresh controller 160, and data buffer 150, or any combination thereof, when memory device 100 enters the DPD mode, mode controller 120 turns on the power supply to these elements before restoring the data.

In some embodiments, if mode controller 120 has reduced the power supply voltage to latch 540 retaining the data inside in the DPD mode, mode controller 120 recovers the power supply voltage for normal operation before restoring the data. For example, if mode controller 120 has reduced the power supply voltage to latch 540 from $V_{core}$ to $V_{core, DPD}$, mode controller 120 recovers the power supply voltage to latch 540 as $V_{core}$ before restoring the data. In some embodiments, the retained data becomes accessible once the power supply voltage is recovered to normal $V_{core}$ because such power supply voltage to latch 540 provides sufficient driving capability to pass the retained data to other circuits.

Figure 7:
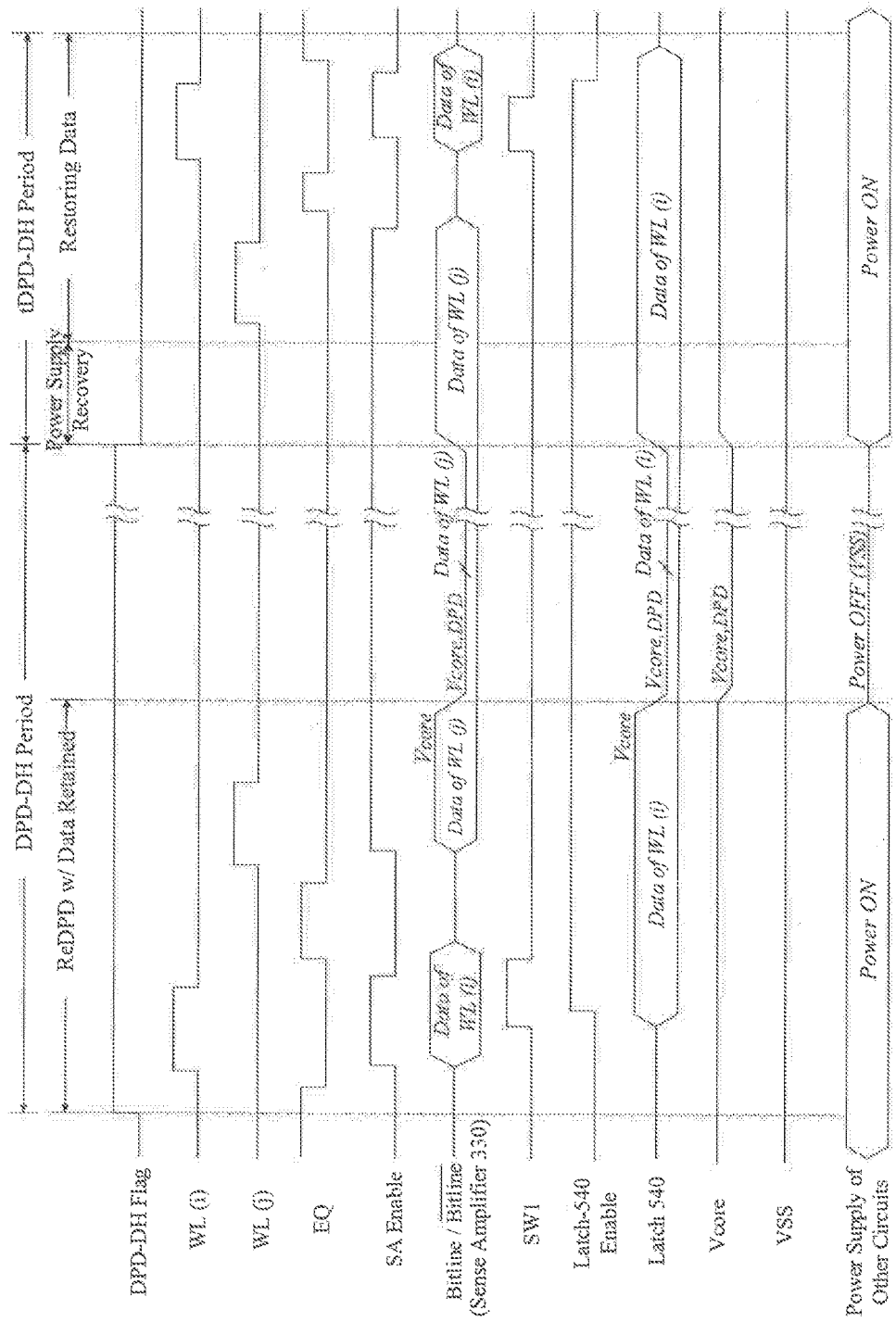
FIG. 7 is another exemplary timing diagram of an exemplary memory device that includes a plurality of the exemplary latches in FIG. 5 and operates in a DPD mode, according to a disclosed embodiment.

FIG. 7 is another exemplary timing diagram of exemplary memory device 100 that includes a plurality of the exemplary latches in FIG. 5 and retains data in the DPD mode, according to a disclosed embodiment. Mode controller 120 controls related control signals in FIG. 7 to activate corresponding modules or circuits of memory device 100 according to the timing diagram. When memory device 100 receives a signal to enter the DPD mode, mode controller 120 controls related control signals to retain data in memory device 100 before entering into the DPD mode. Mode controller 120 retains data of a memory cell coupled to wordline i in latch 540. The operations are similar to those described above for retaining the data in latch 540 according to the signals shown in FIG. 6. However, as shown in FIG. 7, after the data of WL(i) is retained in latch 540, mode controller 120 may also retain data of another memory cell coupled to another wordline j, WL(j), in sense amplifier 330 coupled to Bitline/$\overline{\text{Bitline}}$. The operations are similar to those described above for retaining the data in sense amplifier 330 in FIG. 4.

As another example, in FIG. 2, when the data of the group of memory cells 21 and the group of memory cells 22 are configured to be retained in a DPD mode, mode controller 120 activates wordline 218 and retains data stored in the group of memory cells 21 in four latches (not shown) respectively coupled to bitlines 221-224 in the DPD mode. Mode controller 120 also activates wordline 216 and retains data stored in the group of memory cells 22 in sense amplifiers 251-254 in the DPD mode. When memory device exits the DPD mode, mode controller 120 restores the retained data in sense amplifiers 251-254 to the group of memory cells 22. Mode controller 120 also restores the retained data in the four latches to the group of memory cells 21.

As shown in FIG. 7, mode controller 120 controls memory device 100 to enter the DPD mode after the data are retained in latch 540 and sense amplifier 330. Mode controller 120 maintains power supply to each latch 540 and sense amplifier 330 to keep the data latched. In some embodiments, mode controller 120 may turn off power supply to other circuits of memory device 100 to reduce power consumption in DPD mode. For example, mode controller 120 may turn off power supply to memory array 180, address decoder 140, refresh controller 160, and data buffer 150, or any combination thereof, when memory device 100 enters the DPD mode.

In some embodiments, mode controller 120 may reduce the power supply voltage to each latch 540 and sense amplifier 330 that retain the data in the DPD mode. For example, mode controller 120 reduce power supply voltage to latch 540 and sense amplifier 330 from $V_{core}$ to $V_{core, DPD}$, to reduce current consumption. Latch 540 and sense amplifier 330 still retain the data latched at a lower voltage level. Mode controller 120 holds memory device 100 in the DPD mode with the data retained until receiving a signal to exit the DPD mode.

When memory device 100 receives a signal to exit the DPD mode, mode controller 120 controls memory device 100 to exit the DPD mode accordingly. For example, when the DPD-DH flag signal is deactivated as shown in FIG. 7, mode controller 120 controls each sense amplifier 330 and latch 540 retaining data to restore the data to the memory cells, and controls memory device 100 to exit the DPD mode. For example, mode controller 120 activates WL(j), and the data retained in sense amplifier 330 is restored to the memory cell coupled to wordline j through Bitline/$\overline{\text{Bitline}}$, as shown in FIG. 7. Mode controller 120 also activates WL(i) and SW1, and the data retained in latch 540 may be restored to the memory cell coupled to wordline i through Bitline/$\overline{\text{Bitline}}$, as shown in FIG. 7.

In some embodiments, if mode controller 120 has turned off the power supply to other circuits of memory device 100 in the DPD mode, mode controller 120 turns on the power supply to those circuits of memory device 100 before restoring the data. For example, if mode controller 120 has turned off the power supply to memory array 180, address decoder 140, refresh controller 160, and data buffer 150, or any combination thereof, when memory device 100 enters the DPD mode, mode controller 120 turns on the power supply to these elements before restoring the data.

In some embodiments, if mode controller 120 has reduced the power supply voltage to each latch 540 and sense amplifier 330 retaining the data inside in the DPD mode, mode controller 120 recovers the power supply voltage for normal operation before restoring the data. For example, if mode controller 120 has reduced the power supply voltage to each latch 540 and sense amplifier 330 from $V_{core}$ to $V_{core, DPD}$, mode controller 120 recovers the power supply voltage to latch 540 and sense amplifier 330 as $V_{core}$ before restoring the data. In some embodiments, the retained data becomes accessible once the power supply voltage is recovered to normal $V_{core}$ because such power supply voltage to each latch 540 and sense amplifier 330 retaining data provides sufficient driving capability to pass the retained data to other circuits.

Figure 8:
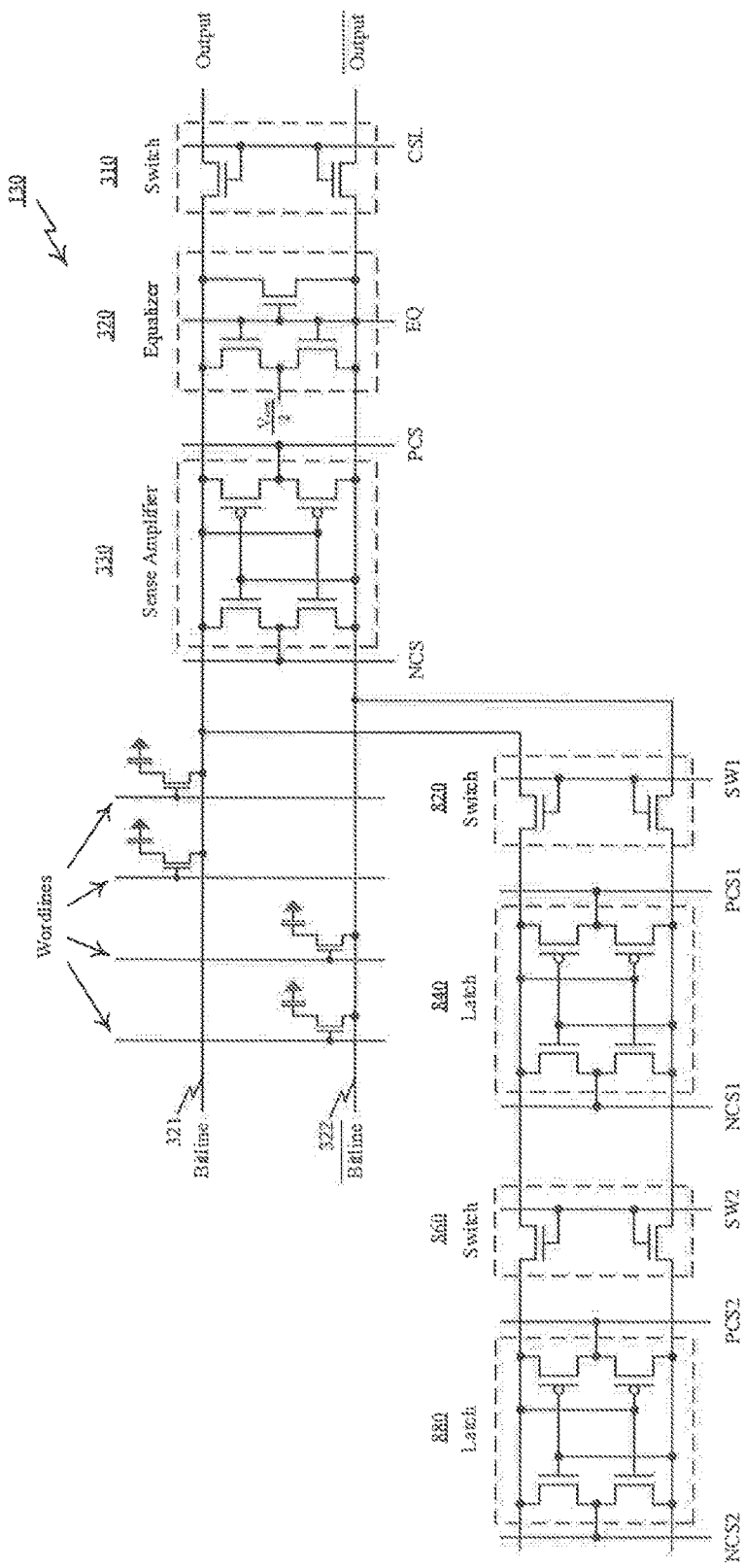
FIG. 8 is an illustration of two exemplary latches coupled to the sense amplifier in FIG. 3.

FIG. 8 is an illustration of exemplary sense amplifier circuit 130 including two exemplary latches 840 and 880 coupled to bitlines to which sense amplifier 330 is coupled in memory device 100, according to a disclosed embodiment. Latch 840 is coupled to Bitline/$\overline{\text{Bitline}}$ through a latch switch 820. Latch switch 820 enables latch 840 to retain data on the coupled bitlines when its enable signal, SW1, is activated. Latch 840 includes, for example, two cascaded p-type MOSFETs and two cascaded n-type MOSFETs, cross-coupled as shown in FIG. 8. Mode controller 120 generates control signals to activate and drive latch 840 to retain data on the coupled bitlines. In some embodiments, latch 840 may include different numbers, types, and/or couplings of transistors.

Latch 880 is also coupled to Bitline/$\overline{\text{Bitline}}$ through a latch switch 860 and latch switch 820. The combination of latch switch 860 and latch switch 820 enables latch 880 to retain data on the coupled bitlines when the enable signals, SW1 and SW2, are both activated. Latch 880 includes, for example, two cascaded p-type MOSFETs and two cascaded n-type MOSFETs, cross-coupled as shown in FIG. 8. Mode controller 120 generates control signals to activate and drive latch 880 to retain data on the coupled bitlines. In some embodiments, latch 880 may include different numbers, types, and/or couplings of transistors. In other words, in this example, sense amplifier circuit 130 further includes latches 840 and 880 as well as their corresponding latch switches 820 and 860.

Figure 9:
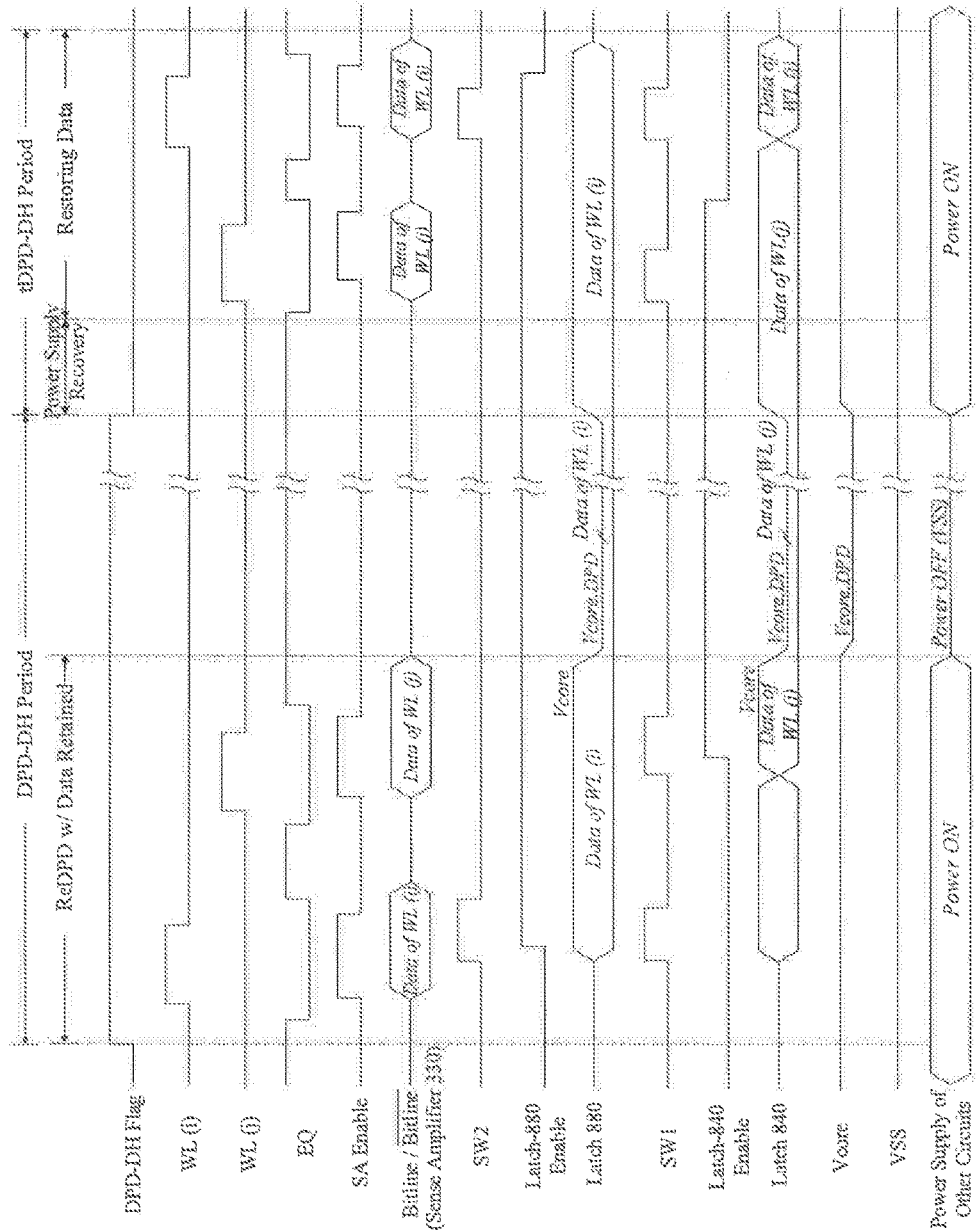
FIG. 9 is an exemplary timing diagram of an exemplary memory device that includes a plurality of the latches in FIG. 8 and operates in a DPD mode, according to a disclosed embodiment.

FIG. 9 is an exemplary timing diagram of exemplary memory device 100 that includes two pluralities of exemplary latches 840 and 880 as well as their corresponding latch switches 820 and 860 in FIG. 8 and retains data in the DPD mode, according to a disclosed embodiment. Mode controller 120 controls related control signals in FIG. 9 to activate corresponding elements or circuits of memory device 100 according to the timing diagram. When memory device 100 receives a signal to enter the DPD mode, mode controller 120 controls related control signals to retain data in memory device 100 before entering the DPD mode. Mode controller 120 causes data of a memory cell coupled to wordline i to be retained in latch 880. The operations are similar to those described above for retaining the data in latch 540 in FIG. 6, except for the enabling of latch 880. As noted above, the combination of latch switch 860 and latch switch 820 enables latch 880. Mode controller 120 activates both SW1 and SW2 to retain data of WL(i) in latch 880. After the data of WL(i) is retained in latch 880, mode controller 120 also retains data of a memory cell coupled to another wordline j in latch 840. The operations are similar to those described above for retaining the data in latch 540 in FIG. 6.

As another example, in FIG. 2, when the data of the groups of memory cells 21, 22 are configured to be retained in the DPD mode, mode controller 120 activates wordline 218 and retains data stored in the group of memory cells 21 in four latches (not shown) respectively coupled to bitlines 221-224 in the DPD mode. Mode controller 120 also activates wordline 216 and retains data stored in the group of memory cells 22 in another four latches (not shown) respectively coupled to bitlines 221-224 in the DPD mode. When memory device 100 exits the DPD mode, mode controller 120 restores the retained data in the latter four latches to the group of memory cells 22. Mode controller 120 also restores the retained data in the former four latches to the group of memory cells 21.

Mode controller 120 controls memory device 100 to enter the DPD mode after the data are retained in latches 840 and 880. Mode controller 120 maintains power supply to latches 840 and 880 to retain the data latched. In some embodiments, mode controller 120 may turn off the power supply to other circuits of memory device 100 to reduce power consumption in the DPD mode. For example, mode controller 120 may turn off the power supply to memory array 180, sense amplifiers 330 in the plurality of sense amplifier circuits 130, address decoder 140, refresh controller 160, and data buffer 150, or any combination thereof, when memory device 100 enters the DPD mode.

In some embodiments, mode controller 120 may reduce the power supply voltage to latches 840 and 880 retaining the data in the DPD mode. For example, mode controller 120 may reduce the power supply voltage to latches 840 and 880 from $V_{core}$ to $V_{core, DPD}$, to reduce current consumption.

Latches 840 and 880 still retain the data latched inside at a lower voltage level. Mode controller 120 holds memory device 100 in the DPD mode with the data retained until receiving a signal to exit the DPD mode.

When memory device 100 receives the signal to exit the DPD mode, mode controller 120 controls memory device 100 to exit the DPD mode accordingly. For example, when the DPD-DH flag signal is deactivated, as shown in FIG. 9, mode controller 120 controls latches 840 and 880 retaining the data to restore the data to the memory cells, and controls memory device 100 to exit the DPD mode. For example, mode controller 120 activates WL(j) and SW1, and the data retained in latch 840 is restored to the memory cell through Bitline/$\overline{\text{Bitline}}$, as shown in FIG. 9. After that, mode controller 120 also activates WL(i), SW1, and SW2, and the data retained in latch 880 is restored to the memory cell through Bitline/$\overline{\text{Bitline}}$, as shown in FIG. 9.

In some embodiments, if mode controller 120 has turned off the power supply to other circuits of memory device 100 in the DPD mode, mode controller 120 turns on the power supply to those circuits of memory device 100 before restoring the data. For example, if mode controller 120 has turned off the power supply to memory array 180, sense amplifiers 330 in the plurality of sense amplifier circuits 130, address decoder 140, refresh controller 160, and data buffer 150, or any combination thereof, when memory device 100 enters the DPD mode, mode controller 120 turns on the power supply to these elements before restoring the data.

In some embodiments, if mode controller 120 has reduced the power supply voltage to latches 840 and 880 retaining the data in the DPD mode, mode controller 120 recovers the power supply voltage for normal operation before restoring the data. For example, if mode controller 120 has reduced the power supply voltage to latches 840 and 880 from $V_{core}$ to $V_{core, DPD}$, mode controller 120 recover the power supply voltage to latches 840 and 880 as $V_{core}$, before restoring the data. The retained data becomes accessible once the power supply voltage is recovered to normal $V_{core}$ because such power supply voltage to latches 840 and 880 may provide sufficient driving capability to pass the retained data to other circuits.

In some embodiments, mode controller 120 further retains data of yet another memory cell coupled to yet another wordline in sense amplifier 330. The operations are similar to those described above for retaining the data in sense amplifier 330 in FIG. 7. Mode controller 120 retains the data in sense amplifier 330 after retaining data in latches 880 and 840. Mode controller 120 restores the data retained in sense amplifier 330 before restoring the data retained in latches 840 and 880.

For example, in FIG. 2, when the data of the groups of memory cells 21, 22, and 23 are configured to be retained in the DPD mode, mode controller 120 activates wordline 218 and retains data stored in the group of memory cells 21 in four latches respectively coupled to bitlines 221-224 in the DPD mode. Mode controller 120 also activates wordline 216 and retains data stored in the group of memory cells 22 in another four latches respectively coupled to bitlines 221-224 in the DPD mode. Mode controller 120 further activates wordline 214 and retains data stored in the group of memory cells 23 in sense amplifiers 251-254 in the DPD mode. When memory device 100 receives a signal to exit the DPD mode, mode controller 120 restores the data retained in sense amplifiers 251-254 to the group of memory cells 23. Mode controller 120 then restores the retained data of wordline 216 to the group of memory cells 22. Mode controller 120 then further restores the retained data of wordline 218 to the group of memory cells 21.

Figure 10:
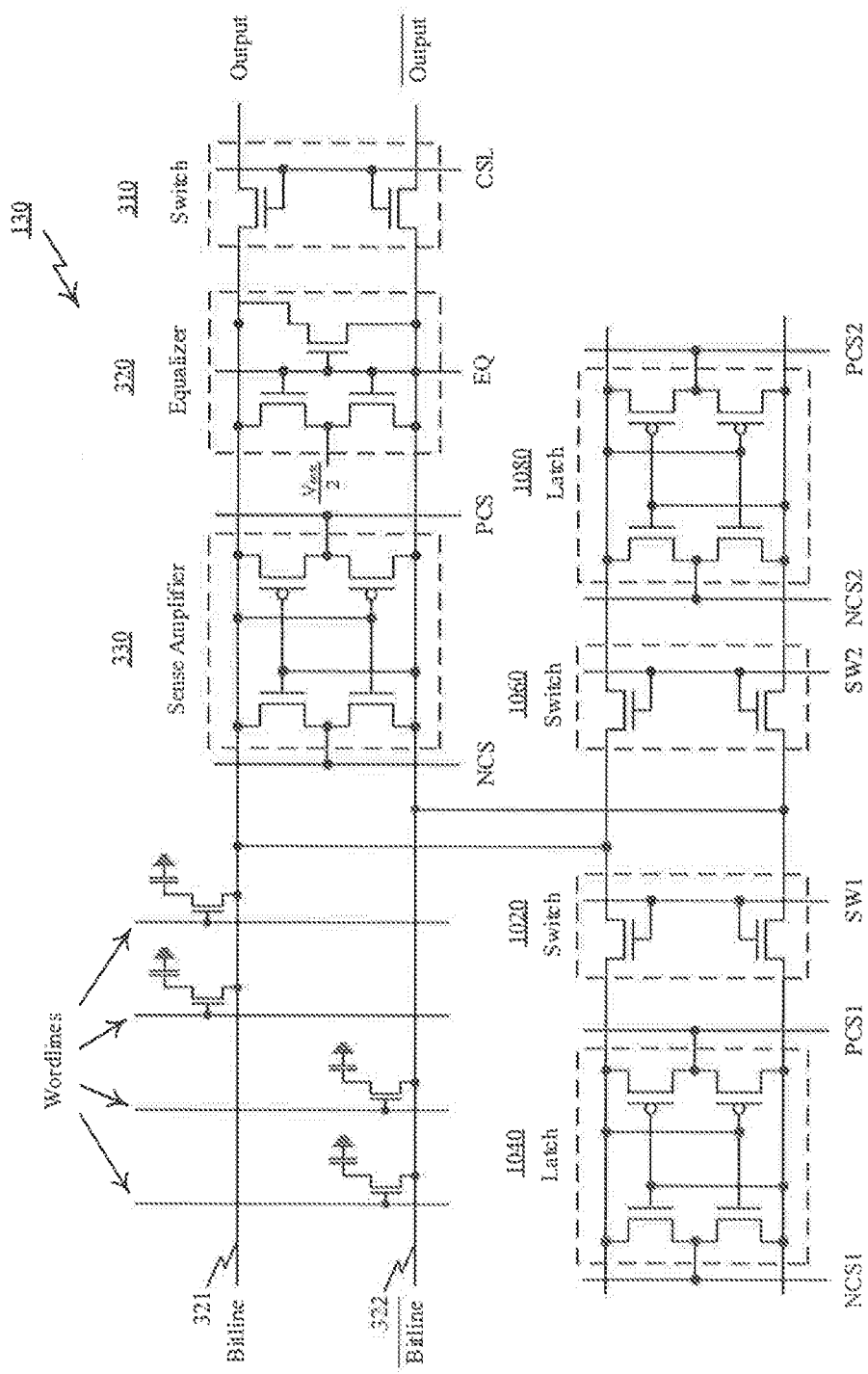
FIG. 10 is another illustration of two exemplary latches coupled to the sense amplifier in FIG. 3.

FIG. 10 is an illustration of exemplary sense amplifier circuit 130 including two exemplary latches 1040 and 1080 coupled to bitlines to which sense amplifier 330 is coupled in exemplary memory device 100, according to a disclosed embodiment. Latch 1040 is coupled to Bitline/$\overline{\text{Bitline}}$ through a latch switch 1020. Latch switch 1020 enables latch 1040 to retain data on the coupled bitlines when its enable signal, SW1, is activated. Latch 1040 includes, for example, two cascaded p-type MOSFETs and two cascaded n-type MOSFETs, cross-coupled as shown in FIG. 10. Mode controller 120 generates control signals to activate and drive latch 1040 to retain data on the coupled bitlines. In some embodiments, latch 1040 may include different numbers, types, and/or couplings of transistors.

Latch 1080 is coupled to Bitline/$\overline{\text{Bitline}}$ through a latch switch 1060. Latch switch 1060 enables latch 1080 to retain data on the coupled bitlines when its enable signal, SW2, is activated. Latch 1080 includes, for example, two cascaded p-type MOSFETs and two cascaded n-type MOSFETs, cross-coupled as shown in FIG. 10. Mode controller 120 generates control signals to activate and drive latch 1080 to retain data on the coupled bitlines. In some embodiments, latch 840 may include different numbers, types, and/or couplings of transistors. In other words, sense amplifier circuit 130 further includes two pluralities of latches 1040 and 1080 as well as their respective latch switches 1020 and 1060.

Figure 11:
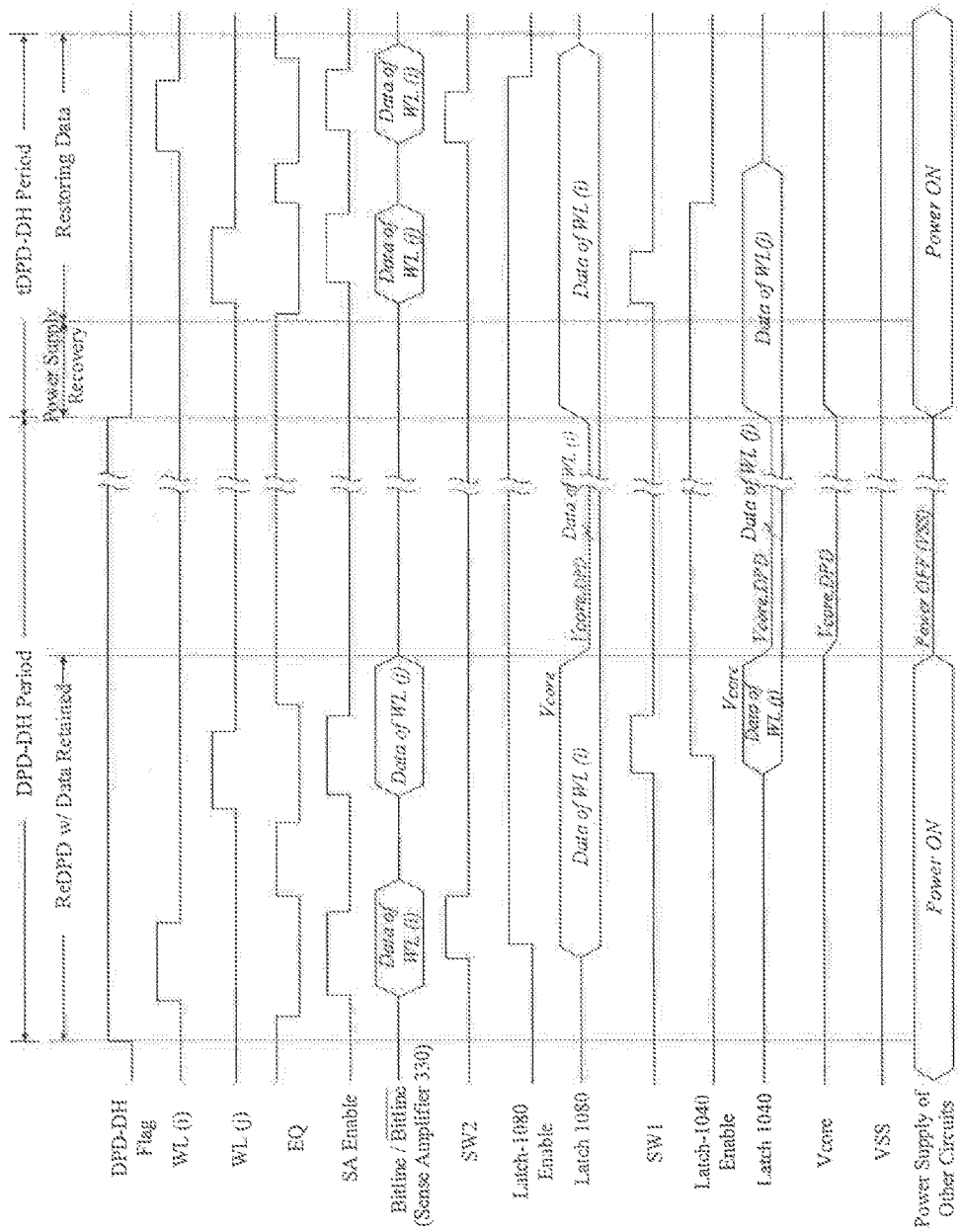
FIG. 11 is an exemplary timing diagram of an exemplary memory device that includes a plurality of the exemplary latches in FIG. 10 and operates in a DPD mode, according to a disclosed embodiment.

FIG. 11 is an exemplary timing diagram of exemplary memory device 100 that includes two pluralities of exemplary latches 1040 and 1080 as well as their respective latch switches 1020 and 1060 in FIG. 10 and retains data in the DPD mode, according to a disclosed embodiment. Mode controller 120 controls related control signals in FIG. 11 to activate corresponding modules or circuits of memory device 100 according to the timing diagram. When memory device 100 receives a signal to enter the DPD mode, mode controller 120 controls related control signals to retain data in memory device 100 before entering into the DPD mode. Mode controller 120 retains data of a memory cell coupled to wordline i in latch 1040. The operations are similar to those described above for retaining the data in latch 540 in FIG. 6. Mode controller 120 also retains data of a memory cell coupled to another wordline j in latch 1080. The operations are similar to those described above for retaining the data in latch 540 in FIG. 6.

As another example, in FIG. 2, when the data of the groups of memory cells 21 and 22 are configured to be retained in the DPD mode, mode controller 120 activates wordline 218 and retain data stored in the group of memory cells 21 in four latches respectively coupled to bitlines 221-224 in the DPD mode. Mode controller 120 also activates wordline 216 and retains data stored in the group of memory cells 22 in another four latches respectively coupled to bitlines 221-224 in the DPD mode. When memory device 100 exits the DPD mode, mode controller 120 restores the retained data in the latter four latches to the group of memory cells 22. Mode controller 120 then restores the retained data in the former four latches to the group of memory cells 21.

Mode controller 120 controls memory device 100 to enter the DPD mode after the data are retained in latches 1040 and 1080. Mode controller 120 maintains power supply to latches 1040 and 1080 to retain the data latched inside. In some embodiments, mode controller 120 turns off the power supply to other circuits of memory device 100 to reduce power consumption in the DPD mode. The operations are similar to those described above for turning off the power supply of other circuits. In some embodiments, mode controller 120 may reduce power supply voltage to latches 1040 and 1080 retaining the data inside in the DPD mode. The operations are similar to those described above for reducing power supply voltage to latches 840 and 880 as described with reference to FIG. 9. Mode controller 120 holds memory device 100 in the DPD mode with the data retained until receiving a signal to exit the DPD mode.

When memory device 100 receives a signal to exit the DPD mode, mode controller 120 controls memory device 100 to exit the DPD mode accordingly. For example, when the DPD-DH flag signal is deactivated as shown in FIG. 11, mode controller 120 controls latches 1040 and 1080 retaining the data to restore the data to the memory cells, and controls memory device 100 to exit the DPD mode. The operations for restoring the retained data from latches 1040 and 1080 are similar to those described above for restoring the retained data from latch 840 in FIG. 9 because latches 1040 and 1080 have individual latch switches 1020 and 1060. There is no need to enable both latch switches 1020 and 1060 for obtaining data retained in either latch 1040 or latch 1080.

In some embodiments, if mode controller 120 has turned off power supply to other circuits of memory device 100 in the DPD mode, mode controller 120 turns on the power supply to those circuits of memory device 100 before restoring the data. The operations are similar to those described above for turning on the power supply of other circuits as described with reference to FIG. 9.

In some embodiments, if mode controller 120 has reduced the power supply voltage to latches 840 and 880 retaining the data inside in the DPD mode, mode controller 120 recovers the power supply voltage for normal operations before restoring the data. The operations are similar to those described above for recovering power supply voltage to latches 840 and 880 in FIGS. 8 and 9. The retained data becomes accessible once the power supply voltage is recovered to normal $V_{core}$ because such power supply voltage to latches 1040 and 1080 provides sufficient driving capability to pass the retained data to other circuits.

In some embodiments, mode controller 120 further causes data of yet another memory cell coupled to yet another wordline to be retained in sense amplifier 330. The operations are similar to those described above for retaining the data in sense amplifier 330 in FIG. 7. Mode controller 120 retains the data in sense amplifier 330 after retaining data in latches 1040 and 1080. Mode controller 120 restores the data retained in sense amplifier 330 before restoring the data retained in latches 1040 and 1080.

For example, in FIG. 2, when the data of the groups of memory cells 21, 22, 23 are configured to be retained in the DPD mode, mode controller 120 activates wordline 218 and retains data stored in the group of memory cells 21 in four latches coupled to bitlines 221-224 in the DPD mode. Mode controller 120 also activates wordline 216 and retains data stored in the group of memory cells 22 in another four latches coupled to bitlines 221-224 in the DPD mode. Mode controller 120 further activates wordline 214 and retains data stored in the group of memory cells 23 in sense amplifiers 251-254 in the DPD mode. When memory device 100 receives a signal to exit the DPD mode, mode controller 120 restores the data retained in sense amplifiers 251-254 to the group of memory cells 23. Mode controller 120 also restores the retained data in latter four latches to the group of memory cells 22. Mode controller 120 further restores the retained data in the former four latches to the group of memory cells 21.

In some embodiments, memory device 100 further includes one or more pluralities of latches coupled to the bitlines. The one or more pluralities of latches are serially coupled to the bitlines as shown in FIG. 8, coupled in parallel to the bitlines as shown in FIG. 10, or any combination thereof. The operations of data retaining are similar to operations illustrated in FIGS. 9 and 11. In other words, memory device 100 is capable of retaining data for various numbers of groups of memory cells coupled to the bitlines by adding one or more pluralities of latches to memory device 100.

Figure 12:
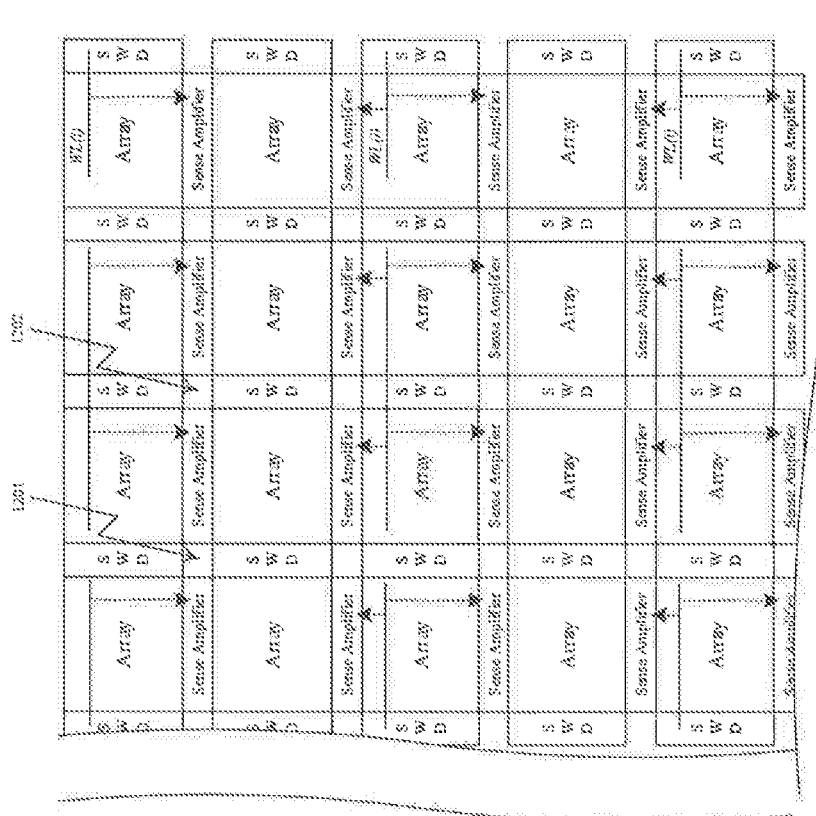
FIG. 12 is an illustration of an exemplary arrangement of memory arrays, sense amplifiers, and sub-wordline drivers in an exemplary memory device, according to a disclosed embodiment.

FIG. 12 is an illustration of an exemplary arrangement of memory arrays, sense amplifiers, and sub-wordline drivers (SWD) in memory device 100, according to a disclosed embodiment. Sense amplifiers may be placed between two memory arrays along a horizontal direction, as viewed in FIG. 12, while sub-wordline drivers may be placed between two arrays along a vertical direction. In some embodiments, latches and latch switches are placed with their associated sense amplifier. Accordingly, in some embodiments, latch 540 and latch switch 520 in FIG. 5 are placed with sense amplifier 330, latches 840 and 880 and latch switches 820 and 860 in FIG. 8 are placed with sense amplifier 330, and latches 1040 and 1080 and latch switches 1020 and 1060 in FIG. 10 are placed with sense amplifier 330.

Alternatively, in some embodiments, latches 540 and latch switches 520 in FIG. 5 may be placed at, for example, intersections 1201, 1202 of sense amplifiers and sub-wordline drivers. In some embodiments, latches 840 and 880 and latch switches 820 and 860 in FIG. 8 may be placed at, for example, intersections 1201, 1202 of sense amplifiers and sub-wordline drivers. In some embodiments, latches 1040 and 1080 and latch switches 1020 and 1060 in FIG. 10 may be placed at, for example, intersections 1201, 1202 of sense amplifiers and sub-wordline drivers.

Figure 13:
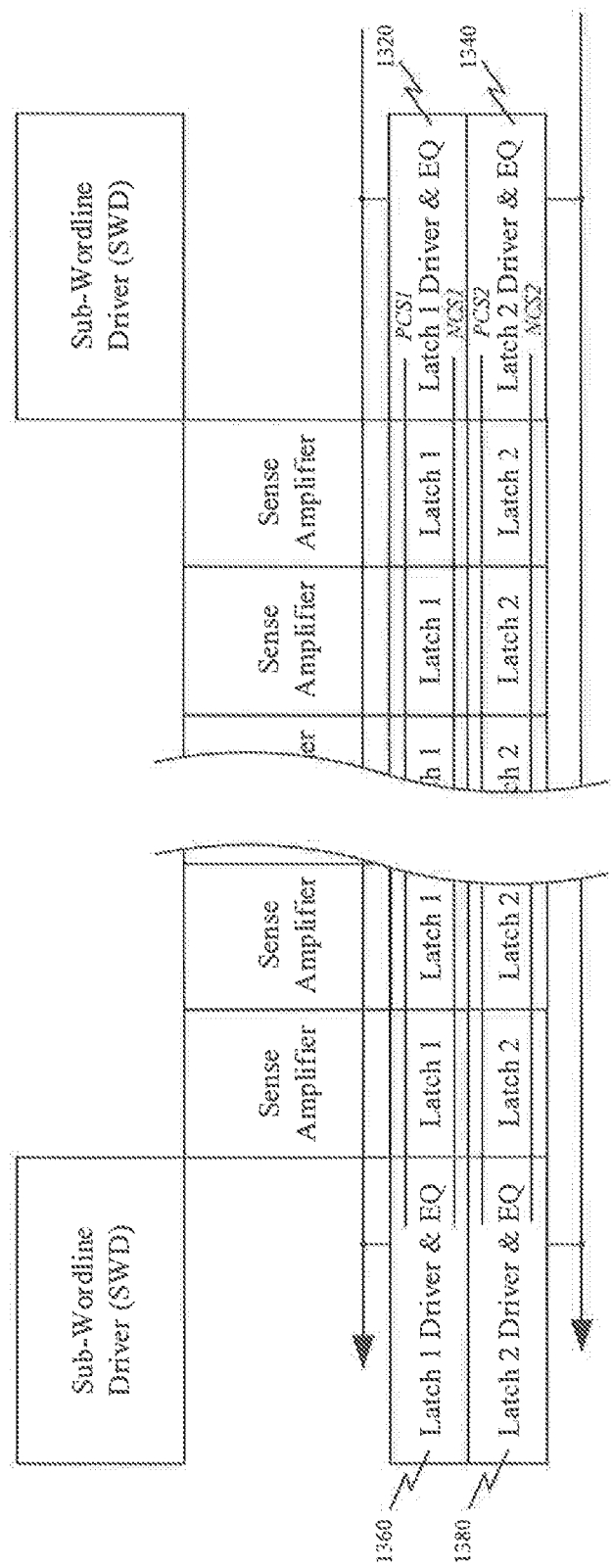
FIG. 13 is an illustration of an exemplary arrangement of sense amplifiers, sub-wordline drivers, and latches in an exemplary memory device, according to a disclosed embodiment.

FIG. 13 is an illustration of another exemplary arrangement of sense amplifiers, sub-wordline drivers, and latches in memory device 100, according to a disclosed embodiment. In some embodiments, latches 540 and latch switches 520 in FIG. 5 may be placed, for example, beneath sense amplifiers in a vertical direction, as viewed in FIG. 13. In some embodiments, latches 840 and 880 and latch switches 820 and 860 in FIG. 8 may be placed, for example, beneath sense amplifiers in a vertical direction, as viewed in FIG. 13. In some embodiments, latches 1040 and 1080 and latch switches 1020 and 1060 may be placed, for example, beneath sense amplifiers in a vertical direction, as viewed in FIG. 13. FIG. 13 also illustrates peripheral circuits arranged above latches. Latch drivers and equalizers 1320, 1340, 1360, 1380 may be placed at, for example, intersections 1201, 1202 of sense amplifiers and sub-wordline drivers.

In some embodiments, memory device 100 further includes a plurality of selection circuits (not shown) coupled to the plurality of wordlines in memory array 180. The selection circuits include appropriate hardware, such as integrated circuits or field programmable gate arrays, or programmable e-fuse circuits. The selection circuits may be configured to select a group of memory cells whose data will be retained when memory device 100 enters the DPD mode. For example, the selection circuits may be configured to select data of one of the groups of memory cells 21, 22, 23 in FIG. 2 to be retained when memory device 100 enters the DPD mode. In this example, the selection circuits are configured to activate one of wordlines 214, 216, 218 according to the selection. In some embodiments, the selection circuits may include a plurality of programmable e-fuse circuits coupled to wordlines. In such a case, mode controller 120 controls the programming of the plurality of e-fuse circuits to select data of one or more wordlines to be retained when memory device enters the DPD mode.

Figure 14:
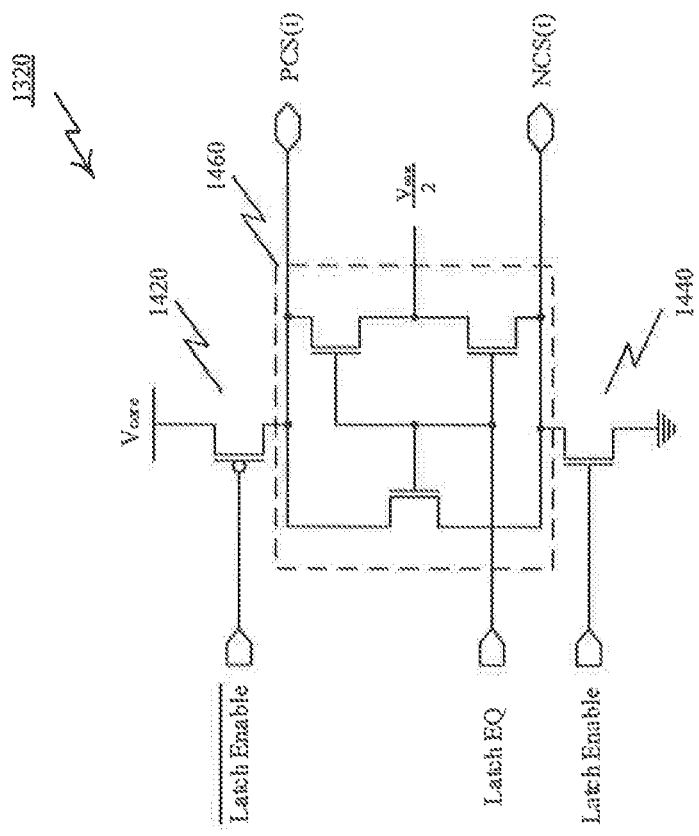
FIG. 14 is an illustration of an exemplary latch driver and equalizer in an exemplary memory device, according to a disclosed embodiment.

FIG. 14 is an illustration of exemplary latch driver and equalizer 1320 for latch 540, 840, 880, 1040, or 1080 in memory device 100, according to a disclosed embodiment. Latch driver and equalizer 1320 includes a p-type MOSFET 1420 connected to a voltage supply $V_{core}$ and an n-type MOSFET 1440 connected to ground, enabled through the $\overline{LatchEnable}$ and the Latch Enable signals, respectively. The Latch Enable signal is, for example, the Latch-540 Enable, Latch-840 Enable, Latch-880 Enable, Latch-1040 Enable, or Latch-1080 Enable signals, as described with reference to FIGS. 6, 7, 9 and 11. Latch driver and equalizer 1320 also includes an Equalizer 1460 to ensure control signals PCS(i) and NCS(i) generated by latch driver and equalizer 1320 are balanced. Mode controller 120, signal generator 125, generates the Latch Enable signal to enable latch driver and equalizer 1320 to generate signals PCS(i) and NCS(i) to drive its corresponding latch to retain data on the bitlines.

Figure 15:
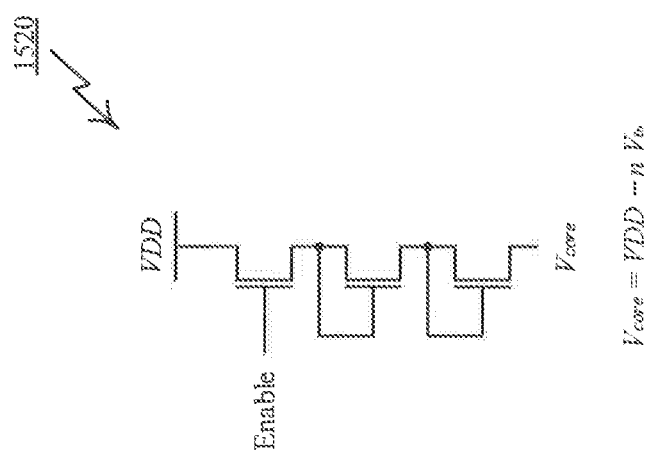
FIG. 15 is an illustration of an exemplary voltage clamp configuration in an exemplary memory device, according to a disclosed embodiment.

FIG. 15 is an illustration of an exemplary voltage clamp circuit 1520 in exemplary memory device 100, according to a disclosed embodiment. Clamp circuit 1520 is configured to generate $V_{core}$ as a power supply voltage for operating any of the sense amplifiers and latches described herein. In addition, as described above, the power supply voltage of sense amplifier 330 and latches 540, 840, 880, 1040, 1080 may be reduced to $V_{core, DPD}$, where $V_{core, DPD}$ is lower than $V_{core}$. The lower voltage may be obtained by using voltage clamp circuit 1520 with a selected number of cascaded transistors. In some embodiments, since sense amplifier 330 and latches 540, 840, 880, 1040, 1080 only retain data in the DPD mode, mode controller 120 selects a power supply voltage $V_{core, DPD}$ at a voltage level that is sufficient to retain the data. In some embodiments, mode controller 120 further controls the power supply voltage of latches 540, 840, 880, 1040, 1080, to be held at an even lower voltage level, $V_{latch, DPD}$, as long as $V_{latch, DPD}$ is sufficient for latches 540, 840, 880, 1040, 1080 to retain data in the DPD mode. Therefore, mode controller 120 may use $V_{latch, DPD}$, where $V_{latch, DPD} < V_{core, DPD}$, as the power supply voltage of latches 540, 840, 880, 1040, 1080 in the DPD mode. In other words, the $V_{core, DPD}$ level shown as the $V_{core}$ signal in FIGS. 6, 7, 9, 11 may be replaced by $V_{latch, DPD}$, where $V_{latch, DPD} < V_{core, DPD}$.

Figure 16:
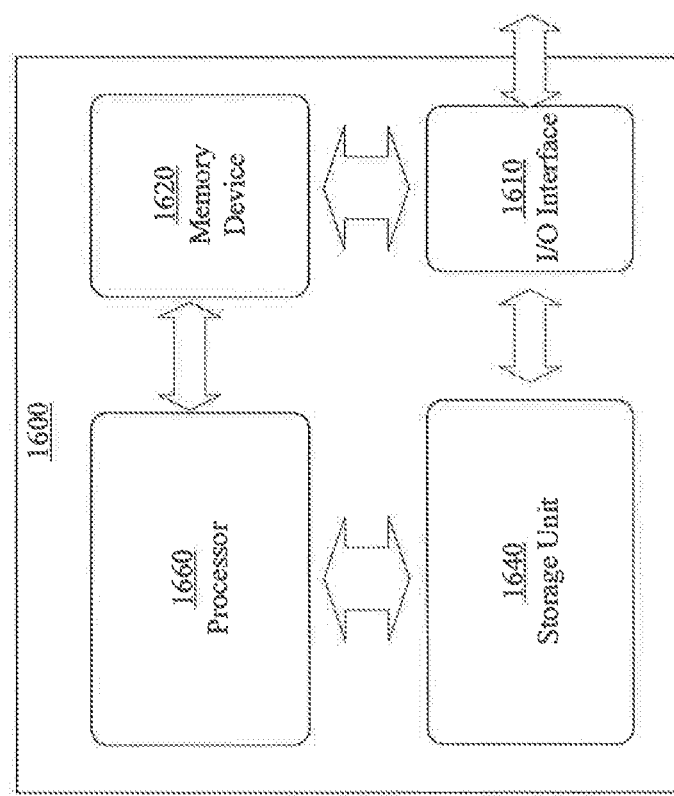
FIG. 16 is an illustration of an exemplary apparatus for data processing, according to a disclosed embodiment.

FIG. 16 is an illustration of an exemplary apparatus 1600 for data processing, according to a disclosed embodiment. Apparatus 1600 includes an exemplary memory device 1620, an exemplary storage unit 1640, an exemplary processor 1660, and an exemplary I/O interface 1610. Processor 1660 is coupled to memory device 1620, storage unit 1640 and even I/O interface 1610. Memory device 1620 is coupled to processor 1660 and I/O interface 1610. Storage unit 1640 is coupled to processor 1660 and I/O interface 1610. For example, apparatus 1600 may be a mobile computer, a mobile phone, a laptop computer, or a desktop computer. Processor 1660 is a processor in any of these devices. Storage unit 1640 may be a disk storage or a flash memory in any of these devices. Memory device 1620 may include one or more DRAMs in any of these devices. Memory device 1620 may be the above described memory device 100, and it may retain a group of data when it enters the DPD mode according to the above descriptions of memory device 100. I/O interface 1610 may buffer input and output data, and pass such data to other modules.

Storage unit 1640 stores an operating system for processor 1660 to load into memory device 1620 when apparatus 1600 is powered on. Processor 1660 accesses instructions, execution status, user data stored in memory device 1620 during data processing. When apparatus 1600 enters into a suspend mode, processor 1660 executes an instruction to send a signal to memory device 1620 to enter the DPD mode. A suspend mode of apparatus 1600 is an operation mode in which apparatus 1600 does not proceed with any operation of data processing. A group of data in memory device 1620 is retained when apparatus 1600 enters the suspend mode. The group of data to be retained in memory device 1620 may, for example, be the kernel of the operating system and the latest execution status. When apparatus 1600 exits the suspend mode, processor 1660 may immediately access the kernel of the operation system and the execution status stored in memory device 1620 because of the data retaining capability of memory device 1620. As a result, processor 1660 may not need to re-load the operating system from storage unit 1640. In some embodiments, processor 1660 may not need to load all user data again from storage unit 1640 or external inputs through I/O interface 1610.

Figure 17:
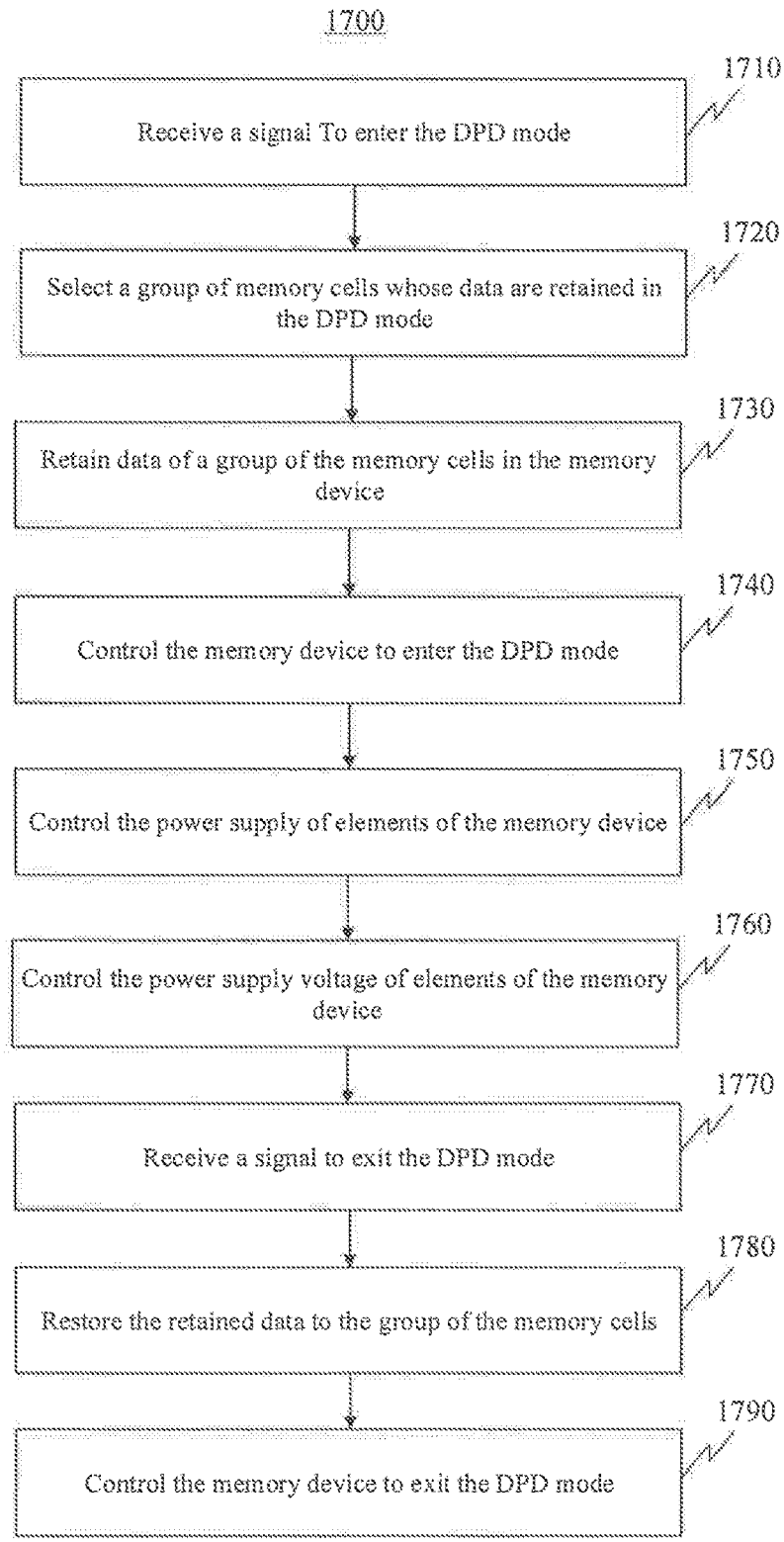
FIG. 17 is a flow chart illustrating an exemplary method of retaining data in a DPD mode in an exemplary memory device, according to a disclosed embodiment.

FIG. 17 is a flow chart illustrating an exemplary method 1700 of retaining data in the DPD mode in exemplary memory device 100, according to a disclosed embodiment. Method 1700 includes receiving a signal to enter the DPD mode (step 1710), retaining data of a group of memory cells in a memory device (step 1730), and controlling the memory device to enter the DPD mode (step 1740).

Step 1710 includes receiving a signal to enter the DPD mode. For example, receiving a signal to enter the DPD mode in step 1710 may include receiving, by memory device 100, a signal to enter the DPD mode from a processor in a computer system. For example, receiving a signal to enter the DPD mode in step 1710 includes receiving, by memory device 1620, a signal to enter the DPD mode from processor 1660 when apparatus 1600 intends to enter a suspend mode. Receiving a signal to enter the DPD mode in step 1710 may include, for example, receiving a timeout signal from a timer that is used to detect an idle period of memory access or data processing. When memory access or data processing is idle for a predefined period of time, the timer may send the timeout signal. A predefined period of time may be, for example, 1, 2, 3, 5, 10, 20, 30 minutes.

Step 1730 includes retaining data of a group of memory cells in a memory device. For example, retaining data of a group of memory cells in a memory device in step 1730 may include retaining data of the group of memory cells 21 in FIG. 2. Retaining data of a group of memory cells in a memory device in step 1730 may include, for example, retaining data of a memory cell coupled to wordline i as shown in FIG. 4.

In some embodiments, retaining data of a group of memory cells in a memory device in step 1730 may include latching the data of the group of memory cells in the sense amplifiers coupled thereto through bitlines. Retaining data of the group of memory cells in a memory device in step 1730 may include, for example, latching data of the group of memory cells 21 in FIG. 2 in sense amplifiers 251-254. For example, retaining data of a group of memory cells in a memory device in step 1730 may include latching data of memory cells coupled to wordline WL(i) in sense amplifier 330 shown in FIG. 4.

In some embodiments, retaining data of a group of memory cells in a memory device in step 1730 may include latching the data in a plurality of latches coupled to bitlines to which the group of memory cells are coupled. For example, retaining data of a group of memory cells in a memory device in step 1730 may include latching data of the group of memory cells 21 in FIG. 2 to four latches coupled thereto through the bitlines 221-224. The result is to latch data of the memory cells coupled to wordline WL(i) in respective latches, such as latch 540, as shown in FIG. 6, via bit lines to which the memory cells are coupled.

In some embodiments, retaining data of a group of memory cells in a memory device in step 1730 may include retaining data of a first group and a second group of memory cells. For example, step 1730 may include latching data of the group of memory cells 21 in four latches coupled thereto through the bitlines 221-224, and latching data of the group of memory cells 22 in sense amplifiers 251-254. The result is to retain data of memory cells coupled to wordlines WL(i) and WL(j) in latch 540 and sense amplifier 330 as shown FIG. 7.

Step 1740 includes controlling the memory device to enter the DPD mode. For example, controlling the memory device to enter the DPD mode in step 1740 may include controlling memory device 100 to entry the DPD mode. In the DPD mode, memory device 100 may not allow any data access.

In some embodiments, method 1700 may also include controlling the power supply of elements of the memory device (step 1750). For example, controlling the power supply of elements of the memory device in step 1750 may include controlling the power supply of the sense amplifiers to be on in the DPD mode and controlling the power supply of at least one of the memory cells, an address decoder, or a refresh controller in the memory device to be off in the DPD mode. Also, for example, controlling the power supply of elements of the memory device in step 1750 may include controlling the power supply of sense amplifier 330 to be on in the DPD mode and controlling the power supply of memory cells 180, address decoder 140, and refresh controller 160 in memory device 100 to be off in the DPD mode, as shown in FIG. 4.

In some embodiments, controlling the power supply of elements of the memory device in step 1750 may include controlling the power supply of the latches to be on in the DPD mode, and controlling the power supply of at least one of the memory cells, an address decoder, or a refresh controller in the memory device to be off in the DPD mode. Also, for example, controlling the power supply of modules of the memory device in step 1750 may include controlling the power supply of latch 540 to be on in the DPD mode, and controlling the power supply of memory cells 180, sense amplifiers 330 in the plurality of sense amplifier circuits 130, address decoder 140, and refresh controller 160 in memory device 100 to be off in the DPD mode, as shown in FIG. 6.

In some embodiments, controlling the power supply of elements of the memory device in step 1750 may include controlling the power supply of the latches and the sense amplifiers to be on in the DPD mode, and controlling the power supply of at least one of the memory cells, an address decoder, or a refresh controller in the memory device to be off in the DPD mode. Also, for example, controlling the power supply of elements of the memory device in step 1750 may include controlling the power supply of latch 540 and sense amplifier 330 to be on in the DPD mode, and controlling power supply of memory cells 180, address decoder 140, and refresh controller 160 in memory device 100 to be off in the DPD mode, as shown in FIG. 7.

In some embodiments, method 1700 also includes controlling the power supply voltage of elements of the memory device (step 1760). For example, controlling the power supply voltage of elements of the memory device in step 1760 may include controlling the power supply voltage of the sense amplifiers in the DPD mode to be at a lower voltage level than that in at least one of the other operation modes. Also, for example, controlling the power supply voltage of elements of the memory device in step 1760 may include controlling the power supply voltage of sense amplifier 330 to be at $V_{core, DPD}$, where $V_{core, DPD}$ is lower than $V_{core}$, as shown FIGS. 4 and 7. Sense amplifier 330 operates in Read and Write operation modes with the power supply voltage at $V_{core}$.

In some embodiments, controlling the power supply voltage of elements of the memory device in step 1760 may include controlling the power supply voltage of the latches in the DPD mode at a lower voltage than that of at least one of the memory array, the sense amplifiers, the address decoder, or the refresh controller in at least one of the other modes. For example, controlling the power supply voltage of elements of the memory device in step 1760 may include controlling the power supply voltage of latch 540 in FIG. 6 or 7 at $V_{core, DPD}$. Memory cells 180, sense amplifiers 330 in the plurality of sense amplifier circuits 130, address decoder 140, or refresh controller 160 in memory device 100 may operate in Read and Write operation modes with the power supply voltage at Vcore, where $V_{core} > V_{core, DPD}$, as shown in FIG. 6 or 7.

In some embodiments, method 1700 may also include selecting a group of memory cells whose data are retained in the DPD mode (step 1720). For example, selecting a group of memory cells whose data are retained in the DPD mode in step 1720 may include selecting the group of memory cells coupled to the first wordline on each bitline as the group of memory cells whose data are retained in the DPD mode. For example, in FIG. 2, the group of memory cells 21 may be selected because wordline 218 is the one closest to sense amplifiers 251-254. In some embodiments, selecting a group of memory cells whose data are retained in the DPD mode in step 1720 may include programming a plurality of programmable fuses. The plurality of programmable e-fuses may be configured to select a group of memory cells whose data are retained in the DPD mode. Selecting the group of memory cells whose data are retained in the DPD mode in step 1720 may include programming the plurality of programmable e-fuses for selection of the group of memory cells.

In some embodiments, method 1700 may also include receiving a signal to exit the DPD mode (step 1770), storing the retained data to the group of memory cells (step 1780), and controlling the memory device to exit the DPD mode (step 1790).

Step 1770 includes receiving a signal to exit the DPD mode. For example, receiving the signal to exit the DPD mode in step 1770 may include receiving, by memory device 1620, a signal to exit the DPD mode from processor 1660 when apparatus 1600 exits its suspend mode. For example, receiving the signal to exit the DPD mode in step 1770 may include receiving, by memory device 100, a request for data access by a processor or an external module.

Step 1780 include restoring the retained data to the group of memory cells. For example, restoring the retained data to the group of memory cells in step 1780 includes restoring the retained data of the group of memory cells 21 in FIG. 2 to the group of memory cells 21, which serves to restore the retained data of the memory cell coupled to wordline i to the memory cell.

In some embodiments, restoring the retained data to the group of memory cells in step 1780 may include restoring the retained data latched in sense amplifiers before restoring the retained data in latches. More particularly, restoring the retained data to the group of memory cells in step 1780 includes restoring the retained data in sense amplifier 330 before restoring the retained data in latch 540, as shown in FIG. 7. In some embodiments, when latches are coupled together serially, restoring the retained data to the group of memory cells in step 1780 includes restoring the retained data in the first latch close to the sense amplifier or the memory cells. More particularly, restoring the retained data to the group of memory cells in step 1780 includes restoring the retained data in latch 840 before restoring the retained data in 880, as shown FIG. 9.

Step 1790 includes controlling the memory device to exit the DPD mode. For example, controlling the memory device to exit the DPD mode in step 1790 includes controlling memory device 1620 to exit the DPD mode. Memory device 1620 may allow data access after it exits the DPD mode. For example, controlling the memory device to exit the DPD mode in step 1790 includes controlling memory device 100 to exit the DPD mode. Memory device 100 may allow data access after it exits the DPD mode.

It will be apparent to those skilled in the art that various modifications and variations can be made to the disclosed memory devices and methods for retaining data in a DPD mode. Other embodiments will be apparent to those skilled in the art from consideration of the specification and practice of the disclosed memory devices and methods for retaining data in a DPD mode. It is intended that the specification and examples be considered as exemplary only, with a true scope being indicated by the following claims and their equivalents.

What is claimed is:

1. A memory device, comprising:
   a memory array including a plurality of memory cells coupled to a plurality of bitlines and a plurality of wordlines;
   a plurality of sense amplifier circuits coupled to the plurality of bitlines, wherein each sense amplifier circuit includes a sense amplifier and is configured to sense and amplify a voltage difference between two of the bitlines coupled thereto;
   an address decoder to receive and decode addresses of memory cells to enable corresponding bitlines and wordlines;
   a refresh controller to control data refreshing of the memory cells; and
   a mode controller to control the memory device to operate in different operating modes including a deep power down (DPD) mode,
   wherein the mode controller controls data of a group of the memory cells, sensed by corresponding ones of the sense amplifier circuits, to be latched in the corresponding sense amplifier circuits when the memory device enters the DPD mode.

2. The memory device of claim 1,
   wherein the mode controller controls the corresponding ones of the sense amplifier circuits so that the data of the group of memory cells are latched in the corresponding sense amplifiers coupled thereto through the bitlines.

3. The memory device of claim 1, wherein the plurality of sense amplifier circuits further includes:
   a plurality of latch switches coupled to corresponding ones of the bitlines to which the group of memory cells are coupled; and
   a plurality of latches coupled through the plurality of latch switches to the bitlines to which the group of memory cells are coupled,
   wherein each sense amplifier circuit includes one of the latch switches and one of the latches,
   wherein each latch switch enables data latching in the latch coupled thereto, and
   wherein the mode controller controls the corresponding ones of the sense amplifier circuits so that the data of the group of memory cells are latched in the plurality of latches coupled thereto through the bitlines.

4. The memory device of claim 3, wherein the group of memory cells is a first group,
   wherein a second group of memory cells are coupled to the bitlines to which the first group of memory cells are coupled,
   wherein the mode controller controls the corresponding ones of the sense amplifier circuits so that data of the second group of memory cells are latched in the corresponding sense amplifiers coupled thereto through the bitlines when the memory device enters the DPD mode.

5. The memory device of claim 3, wherein the plurality of latch switches and the plurality of latches are first latch switches and first latches, and the group of memory cells is a first group, wherein a second group of memory cells are coupled to the bitlines to which the first group of memory cells are coupled, the plurality of sense amplifier circuits further including:
   a plurality of second latch switches coupled to the bitlines to which the first group of memory cells are coupled; and
   a plurality of second latches coupled through the plurality of second latch switches to the bitlines to which the first group of memory cells are coupled,
   wherein each second latch switch enables data latching in the second latch coupled thereto, and
   wherein the mode controller controls the corresponding ones of the sense amplifier circuits so that data of the second group of memory cells are latched in the plurality of second latches when the memory device enters the DPD mode.

6. The memory device of claim 5,
   wherein a third group of memory cells are coupled to the bitlines to which the first group of memory cells are coupled,
   wherein the mode controller controls the corresponding ones of the sense amplifier circuits so that data of the third group of memory cells are latched in the corresponding sense amplifiers coupled thereto through the bitlines when the memory device enters the DPD mode.

7. The memory device of claim 5,
   wherein the plurality of second latches are coupled through the plurality of first latch switches and the plurality of second latch switches to the bitlines to which the first group of memory cells are coupled,
   wherein each combination of one of the first latch switches and one of the second latch switches enables latching of data in the second latch coupled thereto.

8. The memory device of claim 3, further comprising:
   a plurality of sub-wordline drivers coupled to the plurality of wordlines, and a plurality of latch drivers and equalizers coupled to the plurality of latches,
wherein the plurality of latch drivers and equalizers are positioned at intersections of the sense amplifiers and the sub-wordline drivers.

9. The memory device of claim 2, wherein:
the mode controller controls power supply of the sense amplifiers to be on in the DPD mode, and
the mode controller controls power supply of at least one of the memory array, the address decoder, or the refresh controller to be off in the DPD mode.

10. The memory device of claim 3, wherein:
the mode controller controls power supply of the latches to be on in the DPD mode, and
the mode controller controls power supply of at least one of the memory array, the sense amplifiers, the address decoder, or the refresh controller to be off in the DPD mode.

11. The memory device of claim 4, wherein:
the mode controller controls power supply of the sense amplifiers and the latches to be on in the DPD mode, and
the mode controller controls power supply of at least one of the memory array, the address decoder, or the refresh controller to be off in the DPD mode.

12. The memory device of claim 9,
wherein the mode controller controls the power supply of the sense amplifiers in the DPD mode to be at a lower voltage than that in at least one of the other operating modes.

13. The memory device of claim 10,
wherein the mode controller controls the power supply of the latches in the DPD mode to be a lower voltage than that of at least one of the memory array, the sense amplifiers, the address decoder, or the refresh controller in at least one of the other operating modes.

14. The memory device of claim 11,
wherein the mode controller controls the power supply of the sense amplifiers and the latches in the DPD mode to be a lower voltage than that of at least one of the memory array, the address decoder, or the refresh controller in at least one of the other operating modes.

15. The memory device of claim 1, further comprising:
a plurality of selection circuits coupled to the plurality of wordlines,
wherein the plurality of selection circuits enable selection of the group of memory cells whose data are latched when the memory device enters the DPD mode.

16. An apparatus for data processing, the apparatus comprising:
a memory device to store data to be processed, wherein the data to be processed includes at least one of instructions, execution status, or user data;
a processor coupled to the memory device, wherein the processor is configured to access the memory device during processing; and
a storage unit coupled to the processor, wherein the storage unit stores an operating system,
wherein the memory device includes:
a memory array including a plurality of memory cells coupled to a plurality of bitlines and a plurality of wordlines;
a plurality of sense amplifier circuits coupled to the plurality of bitlines, wherein each sense amplifier circuit includes a sense amplifier and is configured to sense and amplify a voltage difference between two of the bitlines coupled thereto;
an address decoder to receive and decode addresses of memory cells to enable corresponding bitlines and wordlines;
a refresh controller to control data refreshing of the memory cells; and
a mode controller to control the memory device to operate in different operating modes including a deep power down (DPD) mode,
wherein the mode controller controls data of a group of the memory cells, sensed by corresponding ones of the sense amplifier circuits, to be latched in the corresponding sense amplifier circuits when the memory device enters the DPD mode, and
wherein a group of the data to be processed are retained in the memory device when the apparatus enters a suspend mode.

17. A method for retaining data in a deep power down (DPD) mode of a memory device including memory cells, the method comprising:
receiving a signal to enter the DPD mode;
controlling the memory device to enter the DPD mode, and
retaining by latching in the memory device data of a group of memory cells when the memory device enters the DPD mode;
wherein the method includes controlling the memory device to operate in different operating modes including the DPD mode.

18. The method of claim 17, further comprising:
receiving a signal to exit the DPD mode;
restoring the retained data to the group of memory cells; and
controlling the memory device to exit the DPD mode.

19. The method of claim 17,
wherein retaining the data of the group of memory cells includes latching the data in sense amplifiers coupled thereto through bitlines of the memory device.

20. The method of claim 17,
wherein retaining the data of the group of memory cells includes latching the data of the group of memory cells in a plurality of latches coupled thereto through bitlines of the memory device.

21. The method of claim 17, wherein the group of memory cells is a first group, the method further comprising:
retaining data of a second group of memory cells coupled to the bitlines to which the first group of memory cells are coupled.

22. The method of claim 21, wherein:
retaining the data of the first group of memory cells includes latching the data of the first group of memory cells in a plurality of latches coupled thereto through bitlines of the memory device, and
retaining the data of the second group of memory cells includes latching the data of the second group of memory cells in sense amplifiers coupled thereto through bitlines of the memory device.

23. The method of claim 19, further comprising:
controlling power supply of the sense amplifiers to be on in the DPD mode; and
controlling power supply of at least one of the memory cells, an address decoder, or a refresh controller in the memory device to be off in the DPD mode.

24. The method of claim 20, further comprising:
controlling power supply of the latches to be on in the DPD mode; and controlling power supply of at least one of the memory cells, the sense amplifiers, the address decoder, or the refresh controller to be off in the DPD mode.

25. The method of claim 23, further comprising:

controlling the power supply of the sense amplifiers in the DPD mode to be at a lower voltage than that in at least one of the other operating modes.

26. The method of claim 24, further comprising:

controlling the power supply of the latches in the DPD mode to be at a lower voltage than that of at least one of the memory array, the sense amplifiers, the address decoder, or the refresh controller in at least one of the other operating modes.

27. The method claim 17, further comprising:

selecting the group of memory cells whose data are retained in the DPD mode before retaining the data of the group of memory cells, wherein retaining the data of the group of memory cells includes retaining the data of the selected group of memory cells.

28. The method claim 27, wherein selecting the group of memory cells includes programming a plurality of programmable fuses.

* * * * *